(12) United States Patent
Kumar et al.

(10) Patent No.: US 11,048,434 B2
(45) Date of Patent: Jun. 29, 2021

(54) COMPUTE IN MEMORY CIRCUITS WITH TIME-TO-DIGITAL COMPUTATION

(71) Applicant: Intel Corporation, Santa Clara, CA (US)

(72) Inventors: Raghavan Kumar, Hillsboro, OR (US); Phil Knag, Hillsboro, OR (US); Gregory K. Chen, Portland, OR (US); Huseyin Ekin Sumbul, Portland, OR (US); Sasikanth Manipatruni, Portland, OR (US); Amrita Mathuriya, Portland, OR (US); Abhishek Sharma, Hillsboro, OR (US); Ram Krishnamurthy, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,024

(22) Filed: Sep. 28, 2018

(65) Prior Publication Data

US 2019/0042160 A1 Feb. 7, 2019

(51) Int. Cl.
*G11C 11/419* (2006.01)
*G06F 3/06* (2006.01)
(Continued)

(52) U.S. Cl.
CPC .......... *G06F 3/0659* (2013.01); *G04F 10/005* (2013.01); *G06F 3/061* (2013.01); *G06F 3/0673* (2013.01); *G11C 7/1006* (2013.01); *G11C 11/418* (2013.01); *G11C 11/419* (2013.01); *G11C 11/54* (2013.01); *G11C 13/003* (2013.01); *G11C 13/004* (2013.01);
(Continued)

(58) Field of Classification Search
CPC .............. G11C 13/0028; G11C 13/003; G11C 13/0026; G11C 11/418; G11C 13/004; G11C 11/419; G11C 13/0061; G11C 7/1006; G06F 3/0659; G06F 3/061; G06F 3/0673; G04F 10/005
See application file for complete search history.

(56) References Cited

U.S. PATENT DOCUMENTS

2003/0128579 A1* 7/2003 Sakimura ................ G11C 11/15
365/158
2011/0072204 A1 3/2011 Chang et al.
(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.
(Continued)

*Primary Examiner* — Khamdan N. Alrobaie
(74) *Attorney, Agent, or Firm* — Compass IP Law PC

(57) ABSTRACT

A memory circuit has compute-in-memory (CIM) circuitry that performs computations based on time-to-digital conversion (TDC). The memory circuit includes an array of memory cells addressable with column address and row address. The memory circuit includes CIM sense circuitry to sense a voltage for multiple memory cells triggered together. The CIM sense circuitry including a TDC circuit to convert a time for discharge of the multiple memory cells to a digital value. A processing circuit determines a value of the multiple memory cells based on the digital value.

19 Claims, 15 Drawing Sheets

(51) Int. Cl.
| | |
|---|---|
| *G04F 10/00* | (2006.01) |
| *G11C 13/00* | (2006.01) |
| *G11C 11/418* | (2006.01) |
| *G11C 7/10* | (2006.01) |
| *G11C 11/54* | (2006.01) |

(52) U.S. Cl.
CPC ...... *G11C 13/0026* (2013.01); *G11C 13/0028* (2013.01); *G11C 13/0061* (2013.01)

(56) References Cited

U.S. PATENT DOCUMENTS

| | | | |
|---|---|---|---|
| 2011/0113115 | A1 | 5/2011 | Chang et al. |
| 2011/0148488 | A1* | 6/2011 | Lee .......................... H03L 7/085 327/159 |
| 2014/0063914 | A1* | 3/2014 | Kanamori ........... G11C 11/5685 365/148 |
| 2014/0292552 | A1* | 10/2014 | Kim ...................... G04F 10/005 341/156 |
| 2015/0357024 | A1* | 12/2015 | Hush ................... G11C 11/4091 365/72 |
| 2016/0063284 | A1* | 3/2016 | Tiwari .................... G06F 7/523 708/620 |
| 2016/0086673 | A1* | 3/2016 | Yamada ................. G11C 16/26 365/185.21 |
| 2016/0266873 | A1* | 9/2016 | Tiwari ................. G11C 7/1006 |
| 2016/0294281 | A1* | 10/2016 | Kulkarni ................ G06F 3/041 |
| 2018/0004687 | A1 | 1/2018 | Bernat et al. |
| 2018/0088850 | A1* | 3/2018 | Willcock .............. G06F 3/0629 |

OTHER PUBLICATIONS

Biswas, A., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Gonugondla, S.K., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 490-492.

Henzler, S., "Chapter 2, Time-to-Digital Converter Basics", Springer Series in Advanced Microelectronics 29, 2, Springer Science+Business Media B.V. 2010.

Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.

Mason, A., "Memory Basics", Michigan State, ECE 410, Chapter 13 Lecture Notes, pp. 13.1-13.34, 2010.

Solanki, Umang, "How does SRAM work?", https://www.quora.com/How-does-SRAM-work, Aug. 17, 2017, 2 pages.

Stone, Harold S. "A Logic-In-Memory Computer", IEEE Transactions on Computers, Jan. 1970, 6, pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

\* cited by examiner

BIT-SERIAL MAC CODE 900

$Y = a*X_0 + b*X_1$ 902  i = bit_length(X) – 1;
904  Y = 0; //set initial value for Y
906  while(i >= 0)
908    Y += a*X_0[i] + b*X_1[i];
910    Y = Y << left_shift_by_1;
912    i -= 1;
914  end

COMPUTE IN MEMORY CIRCUITS WITH TIME-TO-DIGITAL COMPUTATION

FIELD

Descriptions are generally related to memory circuits, and more particular descriptions are related to compute-in-memory circuits with time-to-digital computation.

BACKGROUND

Computer artificial intelligence (AI) has been built on machine learning, particularly using deep learning techniques. With deep learning, a computing system organized as a neural network computes a statistical likelihood of a match of input data with prior computed data. A neural network refers to a plurality of interconnected processing nodes that enable the analysis of data to compare an input to "trained" data. Trained data refers to computational analysis of properties of known data to develop models to use to compare input data. An example of an application of AI and data training is found in object recognition, where a system analyzes the properties of many (e.g., thousands or more) of images to determine patterns that can be used to perform statistical analysis to identify an input object.

Neural networks compute "weights" to perform computation on new data (an input data "word"). Neural networks use multiple layers of computational nodes, where deeper layers perform computations based on results of computations performed by higher layers. Machine learning currently relies on the computation of dot-products and absolute difference of vectors, typically computed with multiply and accumulate (MAC) operations performed on the parameters, input data and weights. The computation of large and deep neural networks typically involves so many data elements it is not practical to store them in processor cache, and thus they are usually stored in a memory.

Machine learning is very computationally intensive with the computation and comparison of many different data elements. The computation of operations within a processor is orders of magnitude faster than the transfer of data between the processor and main memory resources. Placing all the data closer to the processor in caches is prohibitively expensive for the great majority of practical systems due to the memory sizes needed to store the data. Thus, the transfer of data becomes a major bottleneck for AI computations. As the data sets increase, the time and power/energy a computing system uses for moving data around can end up being multiples of the time and power used to actually perform computations.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1A:
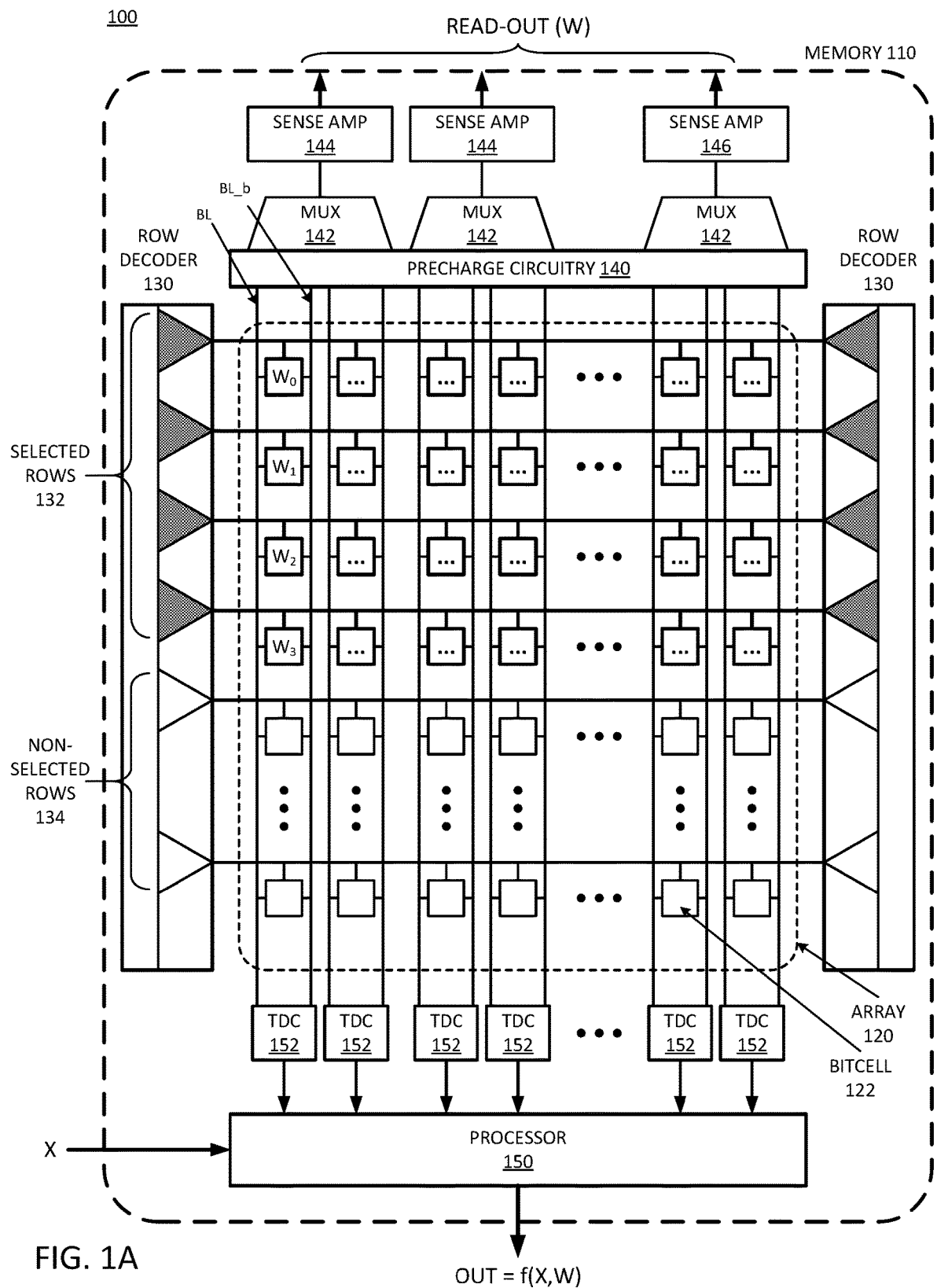
FIG. 1A is a block diagram of an example of a compute-in memory system that performs computations with time-to-digital computation.

Descriptions of certain details and implementations follow, including non-limiting descriptions of the figures, which may depict some or all examples, and well as other potential implementations.

DETAILED DESCRIPTION

As described herein, compute-in-memory (CIM) circuitry performs computations based on time-to-digital conversion (TDC). A TDC circuit detects an amount of time to discharge a voltage and converts the period of time into a digital value. The memory circuit includes an array of memory cells addressable with column address and row address. The memory circuit includes CIM sense circuitry to sense a voltage for multiple memory cells triggered together. The CIM sense circuitry including a TDC circuit to convert a time for discharge of the multiple memory cells to a digital value. A processing circuit determines a value that was stored in the memory cells based on the digital value. The processing circuit can perform CIM computations on the values provided by the TDC circuit.

CIM accelerators perform basic operations such as dot-product and absolute difference of vectors within the memory array directly, which reduces the need to transfer data to a compute engine for a computation. This reduction in data movement between memory and processing units can be used to accelerate algorithms that are memory bandwidth limited. The reduction in data movement can also reduce data transfer energy overhead. CIM accelerators based on analog operations allow for lower cost computation and higher effective memory bandwidth from multibit data read-out per column access. One approach to computation in CIM accelerators is to sense the bitline voltage drop from multiple wordline accesses simultaneously. Such an approach does not scale well, as there is a limited bitline swing available for the voltage to sense. Increases in the number of wordlines simultaneously accessed exponentially increases the sense resolution needed to detect the signal. Thus, multiple wordline access with voltage mode read-out can suffer from poor read precision, poor dynamic range, and high susceptibility to interference from noise.

The traditional approach to addressing the limited read precision from analog computation techniques is by employing limited bit precision, or by adding more capacitance on the bitline, or some other technique. Even with such mitigation techniques, such CIM circuits would limit the algorithms due to reduced bit precision, which will impact the workload performance in terms of accuracy, prediction, or time saving. But employing additional bitline capacitance causes area and energy overheads that result in other tradeoffs.

The use of time-domain based analog computation in memory instead of voltage domain can effectively eliminate the issues above. The time to discharge (td) the bitline voltage depends on the bitcell contents activated during a functional read (FR). In one example, the td also depends on the value of the input word multiplied by the bitcell contents by activation of the wordlines with the word. Thus, the td can be proportional to the product of the input word with the word stored in the bitcells. In one example, a CIM circuit includes a TDC to convert the time to discharge value to the digital time domain using a TDC cell, whose value corresponds to the digital representation of the discharge time. The discharge time should therefore correspond to the desired product of the functional read.

Employing such a time to digital technique in a CIM circuit offers multiple advantages over more traditional voltage or current based CIM techniques. Time domain operations are full swing and therefore allow for lower voltage operation and better process scalability relative to sensing techniques that subdivide the voltage swing. Additionally, TDC circuitry can provide better noise immunity compared to voltage or current based analog computing, because there is a physics-based threshold of subdivision of the sense voltage or current before the noise makes the signal indeterminate. But with the full-swing of TDC circuitry, lower voltage values can be used while maintaining sense precision. An all digital implementation of TDCs allows for low cost time to digital conversion for in-memory computing.

Voltage sensing does not scale well even though it is the currently preferred technique for CIM circuits. But without scaling the voltage down, CIM circuits are subject to increased heat build-up as the rest of the circuitry is scaled to smaller geometries. Scaling voltage down increases the voltage precision required for analog computation, and increases the relative effect of PVT (process, voltage, temperature) variation. The increased precision requirement makes any noise contribution a more significant factor in the system, which in turn can affect error rate of operations performed in the voltage domain. There are practical limits on controlling the PVT as the physical size is scaled to smaller geometries. TDC circuits operate on the principle that the delay between the start and stop times of the discharge represents a value. Such circuitry can scale and provide good resolution even as it is scaled down to smaller geometries. TDCs are not dependent on the geometry size to the same extent voltage scaling is. In addition to the limits on voltage headroom, the reality is that the memory cells do not actually work as constant current sources. Constant current sources exhibit ideal operating behavior, while the memory cells are not constant current sources, and introduce nonlinearities into the system.

CIM circuitry with TDC circuitry can allow improved scaling of CIM operation. Accelerators based on CIM circuits can perform operations such as dot-product and absolute difference of vectors locally within a memory without having to send data to the host processor. CIM accelerators targeted for various deep-learning applications perform multiply-accumulate (MAC) operations within the memory to enable higher throughput dot-product of neuron activation and weight matrices while still providing higher performance and lower energy compared to computation by a host processor. The TDC circuitry enables the CIM MAC operation with increased precision on the same geometry of circuitry relative to current sensing or voltage sensing. TDC circuitry can also be employed with multibit reads, bit serial operation, or a combination of the two.

FIG. 1A is a block diagram of an example of a compute-in memory system that performs computations with time-to-digital computation. System 100 represents an example of a compute-in memory (CIM) block or CIM circuitry. System 100 includes memory 110. Memory 110 represents a memory circuit, which includes memory array 120 made up of multiple bitcells 122. Array 120 can be any size of memory array. In one example, the number of bitcells per row is different than the number of bitcells per column.

Bitcell 122 is an example of a memory cell. The memory cell can be a bitcell in accordance with any of a variety of different technologies. The bitcells are at the intersection of a row with a column. In one example, bitcell 122 is a static random access memory (SRAM) cell. In one example, bitcell 122 represents a 6-transistor (6T) SRAM cell. In one example, bitcell 122 represents a, 8-transistor (8T) SRAM cell. In one example, bitcell 122 represents a 10-transistor (10T) SRAM cell. The bitcells can include more or fewer transistors other than what is specified here. In one example, bitcell 122 represents a memory cell based on a dynamic random access memory (DRAM) technology. In one example, bitcell 122 represents a memory cell in accordance with a resistive-based random access memory (RAM) cell. Resistive-based RAM can include resistive-RAM (Re-RAM), magnetoresistive RAM (MRAM), ferroelectric RAM (FeRAM), dielectric RAM, or other memory.

In one example, bitcell 122 is connected to differential bitlines or column lines. In one example, array 120 of memory 110 has single-ended bitlines. It will be understood that differential bitlines can improve the signal integrity of the sensing of the signal in the bitcells. In system 100, the bitline (BL) or column line is illustrated as BL, and the complementary signal by BL_b or bitline-bar.

Memory 110 includes row decoders 130 to drive rows of array 120. In one example, the rows are wordlines. Memory 110 includes precharge circuitry 140 to charge columns of array 120. In one example, the columns are bitlines. Row decoder 130 includes driver circuitry to apply charge to the rows. In one example, precharge circuitry 140 first charges the columns, and then row decoder 130 activates the rows for access, such as a read. As illustrated, in one example, row decoder 130 selects multiple rows simultaneously. Simultaneous selection refers to charging the rows together for a concurrent access to multiple rows. System 100 illustrates selected rows 132 as the rows charged together for concurrent access. The other rows of array 120 are non-selected rows 134. When multiple rows are selected together, the charge on the different rows combines to perform the equivalent of the multiplication of each row value, with the values stored in a column, and the accumulation of these partial sums.

In one example, memory 110 provides either traditional memory access (e.g., read and write of specific addresses), as well as CIM operation. In one example, the access control for memory 110 determines how to control decoder 130 and precharge circuitry 140 for the different types of operation. The access control refers to control circuitry in a processor or lower level memory circuit that accesses the memory for data. In one example, the processor can support a different instruction or control code to identify CIM operations. In one example, the processor specifically stores data in memory 110 instead of another memory, such as a faster cache, when the data will be used for CIM operations.

Memory 110 includes precharge circuitry 140 to charge the bitlines for access. In a traditional memory access as opposed to a CIM operation, memory 110 includes multiplexers (muxes) 142 and sense amplifiers (amps) 144, and precharge circuitry 140 precharges the bitlines for read access. Traditionally sense amplifiers 144 require so much physical space, multiple column lines are multiplexed together with a mux 142. The outputs of the sense amplifiers are again multiplexed for the bus to the processor circuitry or arithmetic logic unit (ALU) circuitry. The traditional memory access results in a read out of word (W). As illustrated in system 100, word W includes W[3:0]. With a traditional memory read, the stored data flows from memory array 120 to a host processor for computation. The host processor is a digital processor that operates on digital data. Traditional memory access can refer to traditional von Neumann computing systems, which use a central processing unit (CPU) operating on data fetched from a memory unit. In one example, the digital processor is a graphics processor or graphics processing unit (GPU). In one example, the digital processor includes or is an ALU.

The traditional memory access approach does not perform well with data-intensive applications such as machine-learning (ML), which typically perform large amounts of data processing. The data is typically either stored on-chip in SRAM arrays or in off-chip DRAM memory. The system fetches the data from the memory to feed into the host processor. The data for machine learning or deep learning is often referred to as weights. The digital host processor in an accelerator or host system performs operations such as matrix-matrix multiplication, vector-matrix multiplication, element-wise operations, absolute difference computation, or other computation.

For in-memory processing or compute in-memory (CIM), system 100 includes processor 150, which is separate from the host processor. Processor 150 can be referred to as an analog processor in that it operates within memory 110 based on analog signals read from the bitlines. The analog signal refers to a signal that can have different voltage levels based on the CIM computation. Processor 150 can include circuitry to convert the signal into a digital form for operation. In one example, processor 150 is part of memory 110. Processor 150 receives two inputs and performs one or more computations on the inputs. The inputs are W from the memory, and X to compute a function. Thus, processor 150 produces output OUT=f(X,W). The function can be matrix multiplication, absolute difference computation, dot product multiplication, or other ML operation.

CIM circuits can be part of a CIM accelerator to allow a digital processor to offload machine learning operations. CIM circuits can overcome the communication and bandwidth limitations of traditional processing by embedding compute operations within memory 110. A CIM circuit can be considered to include multiple elements of CIM circuitry. In one example, the compute operations in array 120 are directly performed on a data read from memory 110 instead of transferring it to the host processor. Performing the compute operations in array 120 essentially makes the BLs to act as interconnects between memory and the compute engine of processor 150. In one such example, the computations happen directly on the bitline voltage after the read operation that accesses bitcells 122 of selected rows 132.

The read operation in system 100 can be referred to as a functional read (FR), because a read of array 120 results in a functional output from processor 150. As illustrated, memory 110 stores data in column major format (see FIG. 5), as opposed to row major format (see FIG. 7). In one example, system 100 stores data in row major format, as explained in more detail below. In one example, system 100 activates multiple row or wordlines (WL) drivers at the same time to read a word of the column. In one example, to ensure that most significant bits (MSBs) have higher weight in column major format, system 100 enables the MSB row driver for a longer duration than the least significant bit, such as with pulse-width time modulation. In another example, instead of driving the row driver for a longer duration, the same behavior is achieved by using digital to analog converters (DACs) for row access with varying voltage levels for different bit positions, such as with voltage-amplitude modulation. In either case, system 100 accesses the word stored in column major format with bit position weighting. In one example, with TDC components TDC 152, system 100 does not need to weight the separate lines because the TDC can determine the bit values of the bitcells and system 100 can perform weighting in processor 150.

In one example, prior to a read operation, system 100 precharges the columns in array 120 to the memory supply voltage (VDD) with precharge circuitry 140. When system 100 activates multiple row drivers, the columns discharge to a voltage proportional to the values stored in the corresponding rows of the column, as activated by the input vector or input word used to drive the rows. Weighting the rows by bit position results in a column voltage drop ($\Delta V_{BL}$, or delta/change of bitline voltage) that is directly proportional to product of the binary stored word with the input word. For example, for the 4-bit word shown in system 100, assuming that $W_3$ is the MSB and $W_0$ is the LSB, the total current discharge and thus the voltage drop of the column is proportional to [$W_0+2*W_1+4*W_2+8*W_3$]. In one example, processor 150 can apply such weighting based on a value determined from TDC 152.

In one example, TDC 152 captures the $\Delta V_{BL}$ on a sampling capacitance and provides a digital value to the processing unit of processor 150. In one example, TDC 152 can be considered part of processor 150. In one example, TDC 152 is separate from processor 150. In one example, system 100 does not have capacitors for processor 150 or TDC 152 to perform the sensing, as memory 110 can perform the operation based on the capacitance of the bitline itself. In one example, processor 150 includes analog compute blocks with bitline processors (BLPs) and cross bitline processors (CBLPs) to perform operations based on sampling the column lines. In one example, the BLPs or CBLPs do not directly sense the column voltage, but TDCs 152 directly sense the column voltages, convert them into a binary output, and deliver them to one or more BLPs, CBLPs, or other processing blocks of processor 150.

In one example, the TDC 152 feeds values into BLPs and CBLPs to perform unit machine learning operations, for example, the BLP can perform an elementwise multiplication of input X and the output of functional read $W=\Delta V_{BL}$ (W[3:0]), to produce a functional read output of X*W. In one example, the CBLP accumulates the outputs of multiple BLPs and produces a single output, which corresponds to an accumulation operation in a digital processor equal to $\Sigma Xi*Wi$, which can be referred to as a functional output. In one example, memory 110 can perform a MAC operation in memory array 120 with processor 150 to perform one or more operations, such as shift operations, to complete the functional output.

Traditional approaches require sampling of the bitlines with limited voltage headroom, and so required high resolution for reading the bitline voltages. Analog functional read operation with limited voltage headroom limits the ability of the BLP to sample the bitline voltage discharge with sufficient bit precision. In one example, TDCs 152 of system 100 convert the voltages on the column lines to time representation for operation by processor 150. In one example, TDCs 152 can be considered the voltage sensing circuitry. In one example, TDCs 152 are part of the sense circuitry for the CIM functional read operation. The activation of the WL itself can provide multiplication in system 100, with charge sharing on a shared BL to provide accumulation.

Small bitcell arrays that have limited bitline capacitance also traditionally discharge the bitline to ground as soon as multiple wordlines are activated. TDCs 152 enable the use of full rail swing. TDCs 152 generate a digital value based on the values stored in the bitcells or the values stored in the bitcells times the input word on the rows. The TDCs are not limited by the precision of the voltage sensing in the same way operation in the voltage domain is. Thus, TDCs operate approximately the same with different capacitances on the BLs. Analog computation has a limited voltage headroom. The precision of analog voltage sensing for traditional CIM operation is limited by PVT. Thus, the resolution of the resulting CIM computation result would be limited. Time-domain computation has unlimited headroom, since the time range over which transitions can be detected is unlimited. Thus, the resolution of the resulting CIM computations is arbitrarily large, even though the precision of the transition time sensing for CIM with TDSs is also limited by PVT.

As system 100 is scaled to smaller geometries, bitcells 122 introduce nonlinearity into system 100. For example, bitcells 122 in sub nanometer technologies do not act as constant current sources and so the amount of current output can change over the operation of functional read. In one example, system 100 starts and stops TDCs 152 at constant start and stop reference voltages, which normalizes the output current. Thus, TDCs 152 can reduce or eliminate the current source nonlinearities from the functional read.

In general, when the contents of bitcells 122 are read out in the time domain through TDCs 152 and converted into digital values, or when the contents of bitcells 122 are read out as a multiplication with the input data word on the rows in the time domain through TDCs 152 and converted into digital values, the CIM circuitry will not experience the inefficiencies of working only in the voltage domain. Instead of the traditional CIM approaches that are limited in the voltage domain by sensing precision, system 100 with TDCs can operate on full rail swing and is scalable across different process technologies. In one example, the use of TDCs 152 can eliminate the need for binary weighted pulses in row decoder 130, which alleviates the need to generate extremely short pulse widths on chip.

In one example, the local memory processor (processor 150) includes one or more analog processor blocks. In one example, the local memory processor shifts the partial sums (e.g., by one bit), and the circuitry repeats the overall operation. In one example, after N clock cycles, where N is a number equal to the input operand bit-length, system 100 generates a full output. Thus, in one example, the circuitry can perform multibit multi-operand MAC operations per column. In one example, for K subarrays with C columns, each subarray accessing M bit words ($W_i$) per column, and an input vector $\{X_j\}$ of N bits each, the CIM circuitry performs operations to execute Equation 1 per column in N clock cycles, achieving C*K multiplications and K accumulations per cycle.

$$Y_{col}=\Sigma_{i,j}X_{j=0:K-1}*W_{i=0:C-1}$$

TDCs 152 represent circuits or circuitry to convert the time for discharge of bitcells 122 to a digital value. For example, when row decoder 130 charges selected rows 132 to perform a functional read on W[0:3], TDC 152 in the same column can sense the voltage discharge time for the bitlines and convert the time into a digital value. When system 100 includes differential bitlines as illustrated, TDC 152 can apply the differential bitline value to reduce noise in sensing the discharge voltage. For example, TDC 152 can include circuitry to receive the differential pair and latch a value based on comparison of the bitline voltages. In one example, processor 150 operates on the output of TDC 152 as the computational output of the value stored in the memory cells times an input word based on the digital value provided as the TDC output.

Figure 1B:
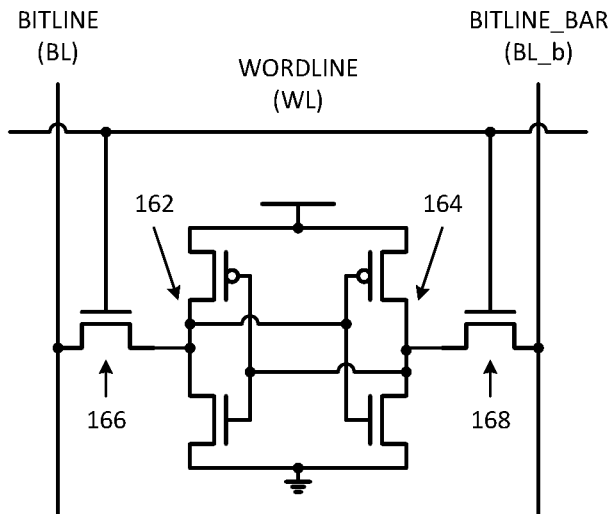
FIG. 1B is a block diagram of an example of a six transistor (6T) bitcell for a compute-in-memory circuit that performs computations with time-to-digital computation.

FIG. 1B is a block diagram of an example of a six transistor (6T) bitcell for a compute-in-memory circuit that performs computations with time-to-digital computation. Circuit 122A represents a 6T bitcell example of bitcell 122 of system 100. The bitcell can alternatively be referred to as a storage cell or a memory cell. The transistors of circuit 122A can be metal oxide semiconductor field effect transistors (MOSFETs) or other type of transistor. Transistors 166 and 168 represent access transistors that control access to circuit 122A during read and write operations.

The access transistors are turned on whenever a wordline (WL) is activated for read or write operation, connecting the storage cell to the complementary bitlines (BL, BL_b). When the wordline is not activated, access transistors 166 and 168 are turned off and the data is retained in the storage cell while power is applied to circuit 122A. An example of circuit 122A includes cross-coupled inverters. Inverters 162 and 164 are cross-coupled inverters to form a latch that stores or holds a bit value as long as the bitcell is powered. Each inverter includes a PMOS (P-channel MOSFET) transistor coupled to VDD, and an NMOS (N-channel MOSFET) transistor coupled to ground.

The gates of inverter 162 are controlled by transistor 168, and are thus driven when transistor 168 is on (which is driven by the WL), and which are coupled to the output of inverter 164. The gates of inverter 164 are controlled by the state of transistor 166, and which in turn are coupled to the output of inverter 162. The storage cell has two stable states which are used to store a logic 0 or logic 1. When the access transistors are on, the gates of the inverters are controlled by the bit value on the bitlines. When the access transistors are off, the inverters each drive the other to hold its value.

Circuit 122A provides one example of a 6T SRAM for a global charge-sharing CIM circuit. In one example of a CIM circuit, a sense amplifier (not shown) coupled to the bitcell converts the local bitline voltage to a full-swing signal. A global charge-sharing technique for a CIM circuit can increase the MAC throughput, with multiply operations performed in bit-serial fashion. A 6T bitcell is compatible with a memory array for a MAC operation in accordance with any example described.

When transistors 166 and 168 are turned on, inverters 162 and 164 of circuit 122A charge the respective bitlines at their outputs (BL for inverter 162 and BL_b for inverter 164). When transistors 166 and 168 are then turned off, the voltage will gradually dissipate into the impedance components of the sensing circuitry (e.g., resistive and capacitive elements). When circuit 122A is used in connection with TDC circuitry, multiple bitcells will be discharged together and the TDC can generate a digital code as an output to represent an amount of time it takes for the bitcells to be discharged to a low voltage reference. The digital code will correspond to the output of value stored the bitcells as activated by the input word.

Figure 1C:
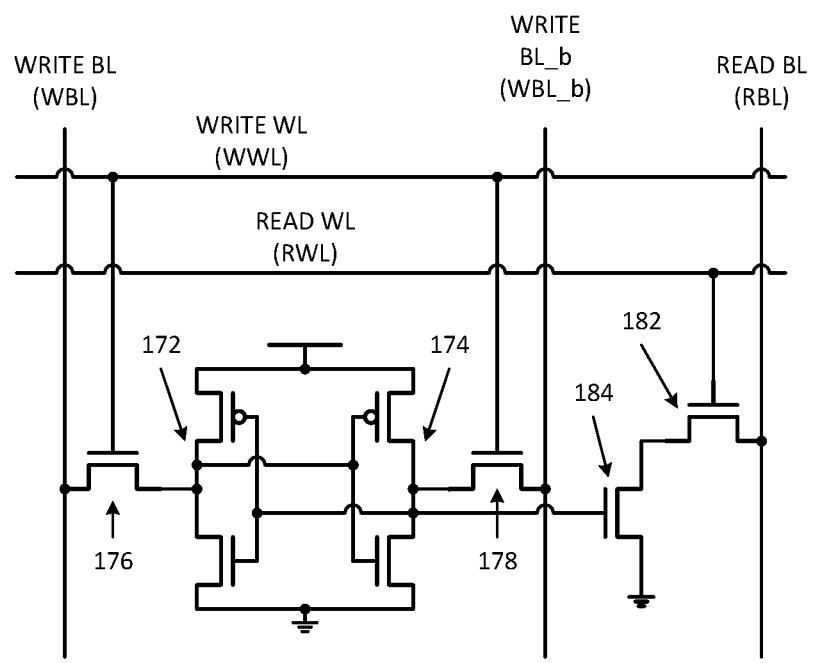
FIG. 1C is a block diagram of an example of an eight transistor (8T) bitcell for a compute-in-memory circuit that performs computations with time-to-digital computation.

FIG. 1C is a block diagram of an example of an eight transistor (8T) bitcell for a compute-in-memory circuit that performs computations with time-to-digital computation. Circuit 122B represents an 8T bitcell or storage cell or a memory cell example of bitcell 122 of system 100. The transistors of circuit 122B can be MOSFETs or other type of transistor. Transistors 176 and 178 represent access transistors that control access to circuit 122B during read and write operations.

The access transistors are turned on whenever a write wordline (WWL) is activated for a write operation, connecting the storage cell to the complementary write bitlines (WBL, WBL_b). When the write wordline is not activated, access transistors 176 and 178 are turned off and the data is retained in the storage cell while power is applied to circuit 122B. An example of circuit 122B includes cross-coupled inverters to form a latch. Inverters 172 and 144 are cross-coupled inverters to form a latch that stores or holds a bit value as long as the bitcell is powered. Each inverter includes a PMOS transistor coupled to VDD, and an NMOS transistor coupled to ground.

The gates of inverter 172 are controlled by transistor 178, and are thus driven when transistor 178 is on (which is driven by the WL), and which are coupled to the output of inverter 174. The gates of inverter 174 are controlled by the state of transistor 176, and which in turn are coupled to the output of inverter 172. The storage cell has two stable states which are used to store a logic 0 or logic 1. When the access transistors are on the gates of the inverters are controlled by the bit value on the bitlines. When the access transistors are off, the inverters each drive the other to hold its value.

Circuit 122B also includes transistor 182 whose gate is connected to the read wordline (RWL). Thus, transistor 182 is an access transistor for a read operation. Transistor 184 is coupled between transistor 182 and ground, with its gate controlled by the state of transistor 178 and thus the value on WBL_b. Transistor 182 pulls read BL (RBL) to the voltage level of transistor 184 when RWL is asserted. Transistor 184 will pull RBL to ground when its gate is asserted (e.g., the inverted output is 1) or will remain high when the inverted output is 0.

Circuit 122B provides one example of a 8T SRAM for a global charge-sharing CIM circuit. In one example of a CIM circuit, an element not specifically shown such as a sense amplifier, a skewed inverter, or a skewed buffer coupled to the bitcell converts the local bitline voltage to a full-swing signal. A global charge-sharing technique for a CIM circuit can increase the MAC throughput, with multiply operations performed in bit-serial fashion. A 6T bitcell is compatible with a memory array for a MAC operation in accordance with any example described. While an 8T bitcell is illustrated by circuit 122A and an 8T bitcell is illustrated by circuit 122B, it will be understood that different architectures can be used, such as a 10T bitcell where two more transistors and another bit line are added to provide a differential read output.

When RWL is charged it will turn on transistor 182. When circuit 122B stores a '1', inverter 174 of circuit 122B will turn on transistor 184 to pull down RBL. Since inverter 174 is the inverting value, the expected output is to pull RBL low when inverter 174 stores a one. When inverter 174 stores a '0', transistor 184 will not turn on, and transistor 182 will increase the charge on RBL via RWL to produce a one on the output. When circuit 122B is used in connection with TDC circuitry, multiple bitcells will be discharged together and the TDC can generate a digital code as an output to represent an amount of time it takes for the bitcells to be discharged to a low voltage reference. It will be understood that the time to discharge the bitcells can be dependent on whether a bitcell is activated for a specific operation based on an input word used to control the row activation. It will be understood that a zero will not charge RBL, and the bitline will discharge to the low voltage reference faster than if RBL is charged based the output of the bitcell read being a one. The digital code will correspond to the output of value stored the bitcells as activated by the input word.

Figure 2A:
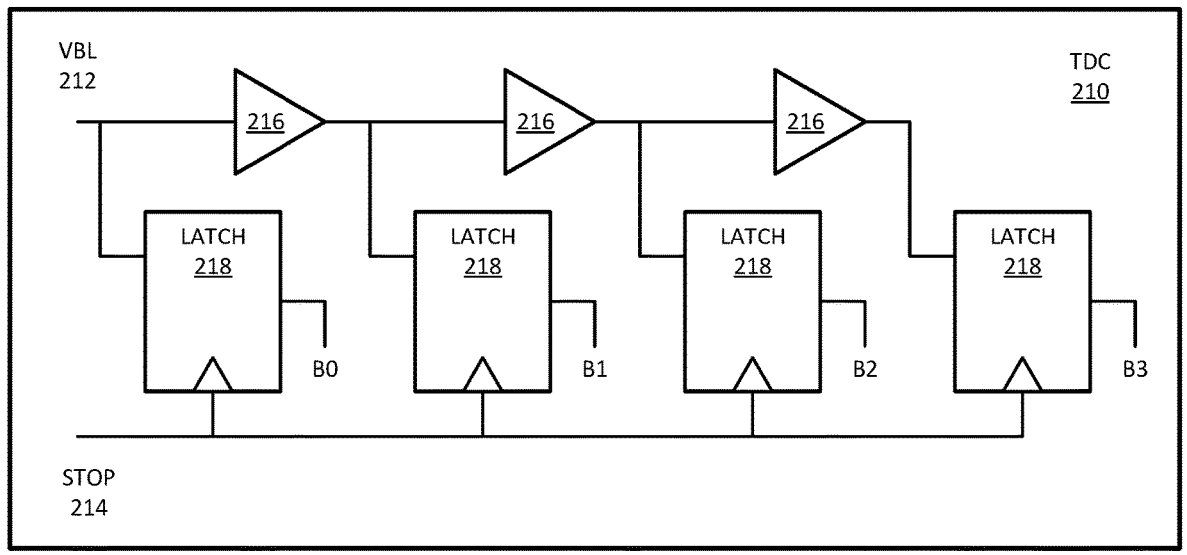
FIG. 2A is a block diagram of an example of a time-to-digital circuit for a compute-in-memory system.

FIG. 2A is a block diagram of an example of a time-to-digital circuit for a compute-in-memory system. TDC 210 represents a time to digital conversion circuit in accordance with TDC 152 of system 100. It will be understood that TDC 210 represents one simplified example of a TDC circuit. Other circuitry can be used to implement TDCs in accordance with the descriptions. TDC 210 represents a TDC circuit that is scalable with different memory architectures and process techniques. TDC 210 does not specifically illustrate a differential line as an input. In one example, the differential bitline voltage can be resolved to a single VBL (bitline voltage) by circuitry outside of TDC 210, or integrated in other circuitry within TDC 210 that is not specifically illustrated.

In one example, TDC 210 receives input VBL 212, which represents a voltage sensed on a bitline or column signal line. In one example, the bitline is a global bitline that connects the output of multiple local bitlines in accordance with any description herein. In TDC 210, VBL 212 is received at a series or sequence of latch components 218 separated by delay cells 216. Each latch and delay cell 216 can be considered a stage of TDC 210, with the first stage not having a delay cell. Thus, TDC 210 illustrates four stage for four bits of resolution, B[3:0]. As such, B0 represents a first bit that latches with the first latch 218. The second stage includes a delay cell 216, and thus, B1 represents a second bit that latches after a delay associated with delay cell 216. In one example, TDC 210 represents a TDC cell with well-defined delay cells 216 in the start path.

It will be understood that the amount of delay in each delay cell 216 can be configured in accordance with the CIM architecture. For example, longer charging pulses to charge the wordlines and thus charge the bitlines can be associated with longer delays to correctly latch the bits to represent the voltage. The length of the delay will also depend on the number of bits of resolution in TDC 210, and thus, six bits of resolution can have shorter delays than four bits of resolution. Additionally, the length of the delay will depend on the threshold voltages set for start and stop of the sampling, with larger voltage ranges corresponding to longer delays.

It will be understood that as illustrated the output of B[3:0] will be a unary code which is also referred to as a thermometer code. In contrast to a binary coding of four bits which can represent 16 separate values, a four-bit unary code represents four distinct values. In one example, TDC 210 includes circuitry to generate a binary output to represent the unary coding generated. Either the unary coding or a binary coding (or a hex encoding or other encoding) can be considered a digital output. The digital output represents bits of output that correspond to the time it takes to discharge the sampling lines (i.e., VBL 212).

Stop 214 represents a stop signal that determines when latches 218 will sample the input. In one example, all latches 218 sample in response to Stop 214. Thus, the amount of voltage to discharge will determine how long the delay series of TDC 210 will charge the inputs of the latches. In one example, Stop 214 is triggered when VBL 212 reaches a low voltage reference. For example, at a Start time (not specifically illustrated), the system can send a transition through a TDC and perform a functional read. The TDC will stop when a VBL 212 reaches the reference voltage. Thus, the timing of setting the samples in latches 218 will be different depending on how much voltage has accumulated on the bitline, because the amount of accumulated voltage will determine how long it takes to discharge to the low voltage reference, in turn triggering Stop 214 to latch the inputs. In another example, the output of a functional read can be connected to the Start input of the TDC. The Stop can be triggered by a replica BL, configured to have the largest possible discharge time, which can provide a deterministic Stop time. In either case, TDC 210 can provide the digital output to a processor or processing block to operate on the digital value.

With consistent trigger voltages for Start and Stop, as set by voltage references, TDC 210 can smooth the otherwise nonlinear operation of the bitcells. The nonlinear operation occurs because the current output will not be constant with changing voltages used to read the bitcell. However, by converting whatever accumulated current and correspondingly the voltage on the bitline to a digital output representative of the time to discharge can hide the nonlinear operation of the bitcells. With the TDC operation of TDC 210, a CIM can generate a digital value representative of the accumulated voltage, and instead of trying to sample the voltage with high resolution to determine the output, the digital output can allow scaling to smaller geometries. The digital output can allow scaling to the simultaneous functional reading of larger numbers of wordlines. Additionally, with the smoothing of the nonlinearities and the use of full swing voltages, TDC 210 provide noise immunity to a CIM circuit.

Many descriptions herein refer to accumulation of voltage on a shared bitline. From one perspective, with TDCs, the CIM can be considered to accumulate in the time domain instead of the voltage domain. However, in accordance with the description of TDC 210, it will be understood that accumulation of voltage on a shared bitline results in accumulation of a time code output of the TDC. Thus, there may be advantage to describing accumulation of voltage on the shared bitline, and there may be advantage to describing accumulation in the time domain. In accordance with the operation of a TDC in the descriptions throughout, accumulation of voltage on a bitline results in a digital TDC output corresponding to the value of the bitcell contents times the input vector used to control the WL activation, just as the voltage accumulates to higher and lower values based on the contents stored in the bitcells and the value of the input word. Thus, the descriptions of voltage accumulation can be considered valid descriptions, and the accumulated voltage will be understood to be converted to a digital time representation in accordance with these descriptions.

Figure 2B:
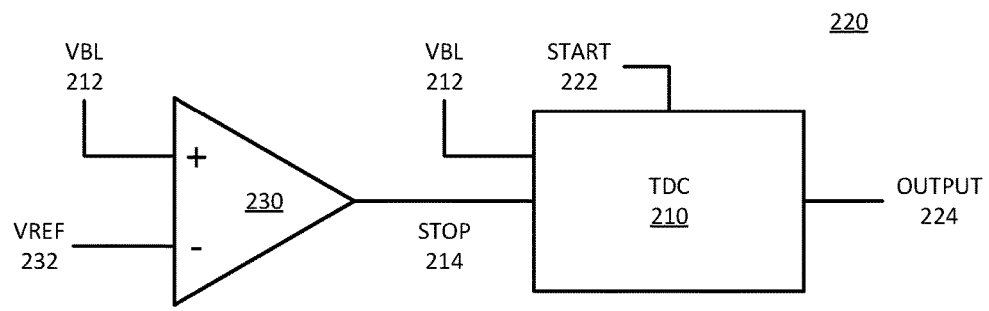
FIG. 2B is a block diagram of an example of a time-to-digital control circuit that samples when the bitline discharges to a reference voltage.

FIG. 2B is a block diagram of an example of a time-to-digital control circuit that samples when the bitline discharges to a reference voltage. Circuit 220 represents a control circuit to generate a Stop signal such as Stop 214 of TDC 210. More specifically, circuit 220 includes TDC 210, which provides output 224. Output 224 can be B[3:0], or more bits if more bits of time resolution are used in TDC 210. The sampling of the signal to generate output 224 is controlled by Start 222 to initiate TDC 210 and Stop 214, which triggers the latch elements of TDC 210 to sample their inputs which receive VBL 212. VREF 232 represents a low voltage reference. Comparator 230 receives VBL 212 and VREF 232 as inputs. When VBL 212 reaches VREF 232, comparator 230 will generate signal Stop 214.

Figure 2C:
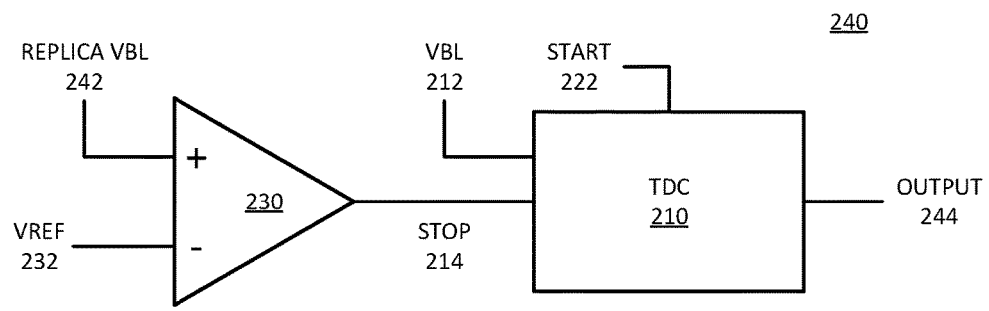
FIG. 2C is a block diagram of an example of a time-to-digital control circuit that samples after a reference discharge time.

FIG. 2C is a block diagram of an example of a time-to-digital control circuit that samples after a reference discharge time. Circuit 240 represents a control circuit to generate a Stop signal such as Stop 214 of TDC 210. More specifically, circuit 240 includes TDC 210, which provides output 244. Output 244 can be B[3:0], or more bits if more bits of time resolution are used in TDC 210. The sampling of the signal to generate output 244 is controlled by Start 222 to initiate TDC 210 and Stop 214, which triggers the latch elements of TDC 210 to sample their inputs which receive VBL 212. VREF 232 represents a low voltage reference. Comparator 230 receives Replica VBL 242 and VREF 232. Replica VBL 242 represents a replica signal of VBL 212 and has the longest possible discharge time to ensure a consistent stop time. Thus, Replica VBL 242 can provide a reference discharge time. When Replica VBL 242 reaches VREF 232, comparator 230 will generate signal Stop 214.

Figure 2D:
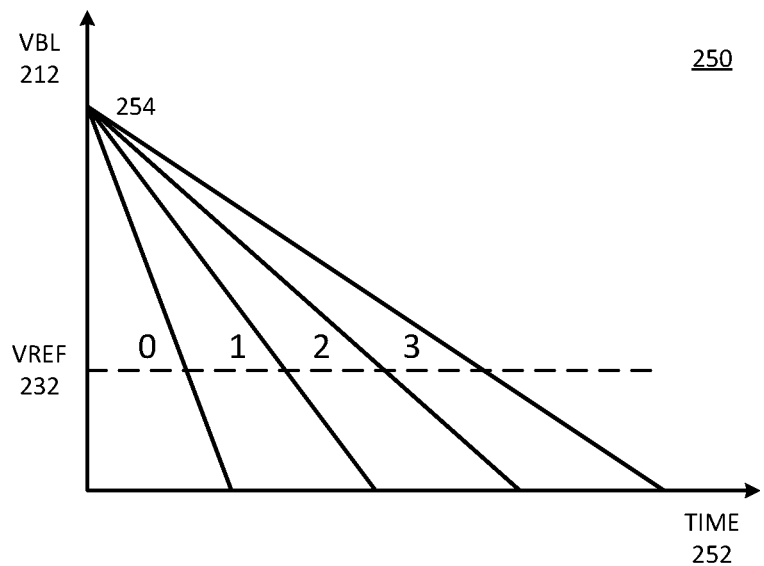
FIG. 2D is a plot of an example of operation for a time-to-digital circuit for a compute-in-memory system.

FIG. 2D is a plot of an example of operation for a time-to-digital circuit for a compute-in-memory system. Diagram 250 provides a representation of an example of a plot of time 252 versus VBL 212. More specifically, time 252 represents a discharge time for the bitline. In one example, the bitline voltage starts from a common level at point 254. The voltage level can be common regardless of the time for discharge because of the precharging of the bitlines to a supply voltage (VDD).

In diagram 250, the bitcell contents are read out in the form of an amount of time taken to discharge the bitline to the preset threshold VREF 242. In one example, a single pulse is applied across multiple wordline drivers simultaneously to perform a functional read. Depending on the bitcell contents, the time taken to fully discharge the bitline varies as shown by the various zero-cross points for the four different lines. It will be understood that expressions related to discharge of the bitcells can refer to the value of the bitcells themselves if they are simply read by themselves, or can refer to the product of the value of the bitcells times an input word used to activate the wordlines. Thus, the value of the bitcell can be ignored for the accumulation and discharge if the input value is a zero, which causes the wordline to not be activated and the bitcell contents to not be read out. The implementation of TDCs in a CIM can support both types of operation.

As shown in diagram 250, the bitline discharges at a rate proportional to the functional read output values. Looking from left to right, different discharge times can correspond to a 0, 1, 2, or 3 as the stored bitcell contents, as an example. The time taken to discharge is measured as the time taken for the bitline voltage to reach the preset threshold of VREF 232. For example, if the bitcell content is 00b, the bitline discharges at a much faster rate compared to other values. A TDC cell (such as TDC 210 of FIG. 2A) converts the time to discharge to a digital value.

In one example, before a functional read operation, the system propagates a rising pulse along the start path in all TDCs, across all columns. In one example, once the bitline voltage of a column reaches VREF, the system applies a stop signal to the TDC, which latches all flip-flops. In one example, the flip-flops are latched through its channel undelayed, generating a digital code as an output.

Figure 2E:
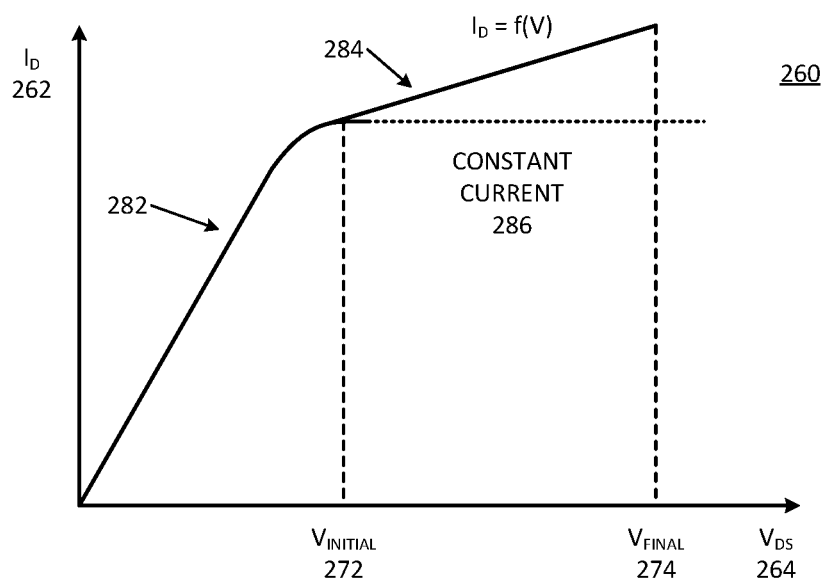
FIG. 2E is a plot of an example of circuit-equivalent operation for a compute-in memory circuit with time-to-digital computation.

FIG. 2E is a plot of an example of circuit-equivalent operation for a compute-in memory circuit with time-to-digital computation. Diagram 260 illustrates a curve of a typical I-V (current versus voltage) characteristic of a bitcell. Diagram 260 shows the non-idealities of the bitcell current response, and how the operation of the TDCs can limit the effects of the nonlinear operation of the bitcells.

In one example, the bitline discharge is full swing making the TDC based computation scalable to different process technologies. Additionally, the use of TDCs can provide better immunity to the memory device pass gate dependence on drain-source voltage, where the bitcell does not act as a constant current source. The memory device drain current could vary because of channel length modulation or triode region operation. In such a scenario, the drain to source voltage ($V_{DS}$) swings between two states (Vinitial 272 and Vfinal 274) and the drain current ($I_D$) is defined by the equation, $I_D=f(V)$.

Diagram 260 illustrates axis 262 as a measure of $I_D$, and axis 264 as a measure of $V_{DS}$. The portion of the curve labeled 282 is the ramping portion. After the knee of the curve, portion 284 illustrates the nonlinear response of ID=f(V) for a bitcell such as bitcell 122 described above. The idealized operation of the bitcell is illustrated as constant current 286. The difference between constant current 286 and the $I_D$ curve at 284 would traditionally introduce nonlinearity. It will be understood that the representation in diagram 260 illustrates a non-ideality, but there could be other types of non-ideality in the curve. Thus, portion 284 of the curve can take different forms depending on the system architecture, but in each case the linear operation of the TDC can hide the nonlinearity from the functional read output.

With a TDC, the output is controlled by time to discharge, which can be given as Equation 2.

$$t \propto C \sum_{i=n-1}^{0} 2^i d^i \int_{V_{initial}}^{V_{final}} \frac{dV}{I(V)}$$

The integral term evaluates to a constant because the initial and final voltages are constant. In one example, the fixed initial voltage is the VDD or other high reference voltage to which the line is precharged. The fixed final voltage is a low voltage reference (such as VREF 242) which represents the floor for the discharge, or the low voltage point at which the discharge time is sampled or determined. With the integral (nonlinearity) reducing to a constant (linear), the entire output equation is linear, which provides immunity to nonidealities in the constant current source operation region of 284. Even though the bitcell functions as a nonideal current source, the operation based on TDC functional reads circumvents this condition by providing an output value proportional to the functional read output. Thus, the operation based on using the TDC approximates the operation that would be achieved with constant current 286. The circuit-equivalent functional read is as though the bitcell provided a constant current. As such, CIM circuitry with TDCs is scalable to arbitrary read precision by increasing the delay of the bitcell read, while conventional readout schemes suffer from reduced precision due to limited voltage headroom.

In one example, the in-memory processor uses the digital output from the TDC cell directly for further computations such as multiplication, accumulation, or other operations, depending on the workload being mapped. In one example, the CIM circuit can perform direct multiplication using a binary TDC output or converting the TDC output to a binary value. In one example, the CIM circuit can perform direct multiplication through bit-serial operation for higher precision inputs. Bit-serial operation refers to accumulation and shift of the outputs for different wordlines.

Figure 3:
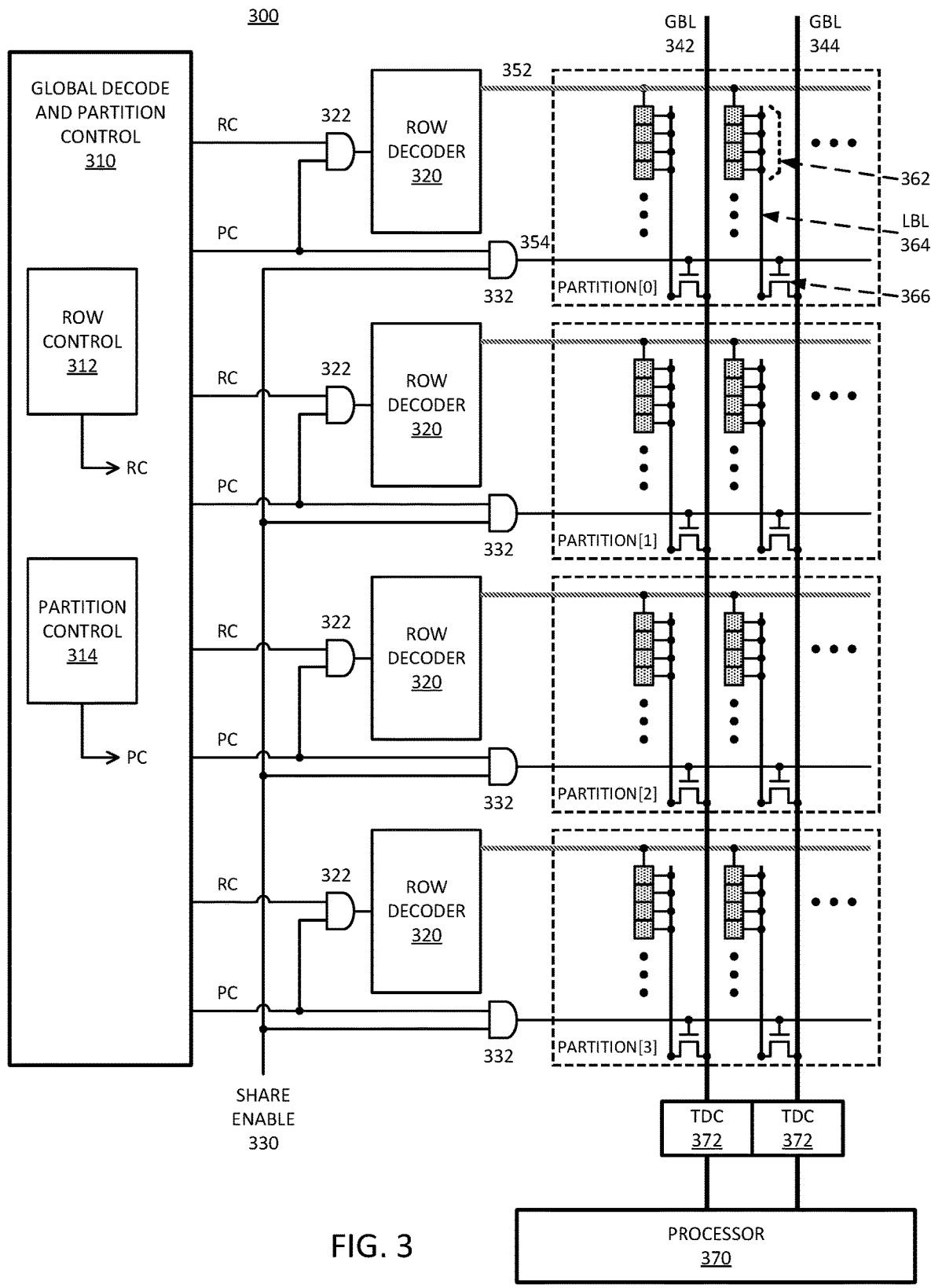
FIG. 3 is a block diagram of an example of a compute-in memory circuit with time-to-digital computation.

FIG. 3 is a block diagram of an example of a compute-in memory circuit with time-to-digital computation. System 300 provides an example of a CIM circuit in accordance with system 100 of FIG. 1. System 300 includes a memory array, which is not specifically identified, but includes rows and columns of storage cells or bitcells. In one example, the memory array is partitioned. System 300 represents four partitions, Partition[3:0], but it will be understood that more or fewer partitions can be used. Partitioning the memory array into multiple subarrays allows control over rows or wordlines by local row decoders, which can access multiple rows simultaneously per subarray.

Row decoders 320 represent the local row decoders, with one row decoder 320 per partition. In one example, system 300 includes global decode and partition control 310. Control 310 provides logic devices and circuitry to resolve memory access requests to a specific subarray, or a specific partition as illustrated. In one example, control 310 provides control signals to control row decoders 320 and access to the partitions. In one example, control 310 includes row control 312, which represents logic to generate a row control signal. The row control signal is abbreviated in system 300 as "RC", and control 310 sends appropriate row control signals to the respective row decoders 320 of the various partitions. In one example, control 310 includes a partition control 314. Partition control 314 represents logic to generate a partition control signal to select a partition, where the selected partition can be referred to as the "turned-on partition", being the partition to be accessed. The partition control signal is designated as "PC" (for "partition-control") in system 300. In one example, the PC signal can select multiple partitions at the same time to be accessed.

In one example, system 300 controls the row access with the PC signal. The PC signal can activate all or a selected/chosen subset of the subarrays simultaneously. Activating multiple subarrays simultaneously provides a tradeoff in between maximum throughput (e.g., by performing a functional read operation on words stored in multiple different partitions) and the energy required to perform the functional read operation. It will be understood that deactivated subarrays do not discharge their local bitlines (LBLs), and thus do not consume dynamic read energy.

In one example, system 300 also controls the row access with the RC signal, which selects the specific rows to be accessed. As illustrated, the PC signal can be ANDed with the RC signal with AND gates 322 to provide the row address information to row decoder 320 only when the partition for the row decoder is selected. System 300 only illustrates a single row line coming from row decoder 320 into the partitions, but the line represents one or more selected rows or WLs per partition. The partitions illustrate multiple bits or storage cells coupled to the wordline. The diagram can be understood to represent either column major formatting or row major formatting. With column major formatting, it will be understood that row decoder 320 can activate multiple rows per partition. With row major formatting, multiple BLs can be precharged to be accessed when the WL is activated. Storage cells are accessed by the combination of row and column access control.

In one example, system 300 includes both local column lines or local BLs (LBLs) 364 as well as global column line or global BLs (GBLs). LBLs are local to a partition, and GBLs connect multiple LBLs to processor 370 via TDCs 372. In one example, each GBL couples to a separate TDC cell. In one example, LBLs connect to only a partition of rows of the memory array, or only to a portion of the memory array. In one example, GBLs connect LBLs together for a column address to be accessed by the processing resources.

In one example, LBLs and GBLs are precharged before a functional-read, and LBLs are connected to a shared GBL per column. In one example, system 300 includes switches in the partitions to couple respective LBLs to associated GBLs. For example, Partition[0] includes switch 366 to couple LBL 364 to GBL 344 to perform a functional read of the data of storage cells 362. In one example for storage cells 362, system 300 performs multibit current summing per column. For purposes of illustration, GBL 342 is also illustrated, which connects to other LBLs for access to other bits. It will be observed that GBL 342 connects LBLs of the partitions to processor 370, and GBL 344 connects other LBLs of the partitions to processor 370. As seen, there are separate TDCs 372 for GBL 342 and GBL 344.

Consider the example further of Partition[0]. The output of row decoder 320 associated with Partition[0] is labeled as signal line 352, which represents one or more WLs for the partition. In one example, system 300 includes AND gates 332 to AND the PC signal with a signal Share Enable 330. Share Enable 330 can control the operation of switch 366 for a selected partition. For a partition selected by the PC signal, and with sharing enabled by Share Enable 330, signal 354 from AND gate 332 turns switch 366 on, connecting LBL 364 to GBL 344. Share Enable 330 provides control over the connection of the LBLs to the GBLs to enable charge-sharing of LBLs on the GBLs. In one example, control 310 disables the WLs (via the RC signal) and enables Share Enable 330 to activate LBL to GBL connections.

Thus, system 300 has timing control over the functional read operations. As such, system 300 can compute the timing to make the connection of the LBLs to the GBLs for different operations. For example, for multi-row access, simultaneous access to two rows may take less time than simultaneous access to four rows to allow the current sharing to occur. Control 310 represents host system control that can make determinations of the timing control to be used to effectuate the operations, such as MAC operations. After allowing sufficient time for current summing on the LBLs controlled by WLs, control 310 can issue Share Enable 330 to cause connection of the LBLs to the GBLs to trigger charge sharing on the GBLs. In one example, control 310 uses the same PC signal to control the LBL to GBL connect switches.

TDCs 372 sample the voltage accumulated on respective GBLs, and more specifically measure how long it takes a specific GBL to discharge its accumulated voltage. The TDCs 372 convert the time to discharge into a digital representation that indicates a resulting bit value of the accessed cells. Processor 370 receives the digital values from TDCs 372 and performs additional computations to complete the functional read operation. In one example, processor 370 performs one or more shift operations to complete the computation.

In one example, after operation by processor 370, control 310 precharges the LBLs and GBLs to a VDD value for the memory array and de-asserts Share Enable 330. In one example, after a number of functional read cycles equal to a bit length of input vectors, processor 370 finalizes a high throughput MAC operation by a final addition per column. The additions can be performed on the digital values of TDCs 372. It will be understood that the number of partitions and the number of rows accessed per subarray are design choices that depend on hardware throughput specifications. System 300 can be designed in accordance with different throughput specifications. Thus, system 300 supports different configurations for different MAC throughputs, based on system design.

Thus, system 300 can include partitioning based on the memory architecture and how the system is configured to perform machine learning operations. It will be understood that system 300 enables performing various computations in the memory resources instead of operations that would traditionally be executed by a host processor (not specifically shown), or by processor 370. In one example, system 300 maps multiply operations from processor 370 to activation of the WL itself. In one example, the CIM resources can accomplish one-bit multiply operations on a number of partitions. In one example, system 300 enables current summing to implement a multiply with a multibit value function, and charge sharing to implement an accumulate function. TDCs 372 measure a discharge of the final shared charge and generate a digital output corresponding to the discharge time.

In one example, processor 370 has minimized area and power cost relative to a processor for CIM circuitry that is not partitioned. For example, partitioning can select specific resources for access, which can allow the use of only a single analog processing block for sampling GBLs for the overall CIM block, instead of one analog processing block for each subarray. In one example, partitioning enables operating on multiple words concurrently.

Figure 4A:
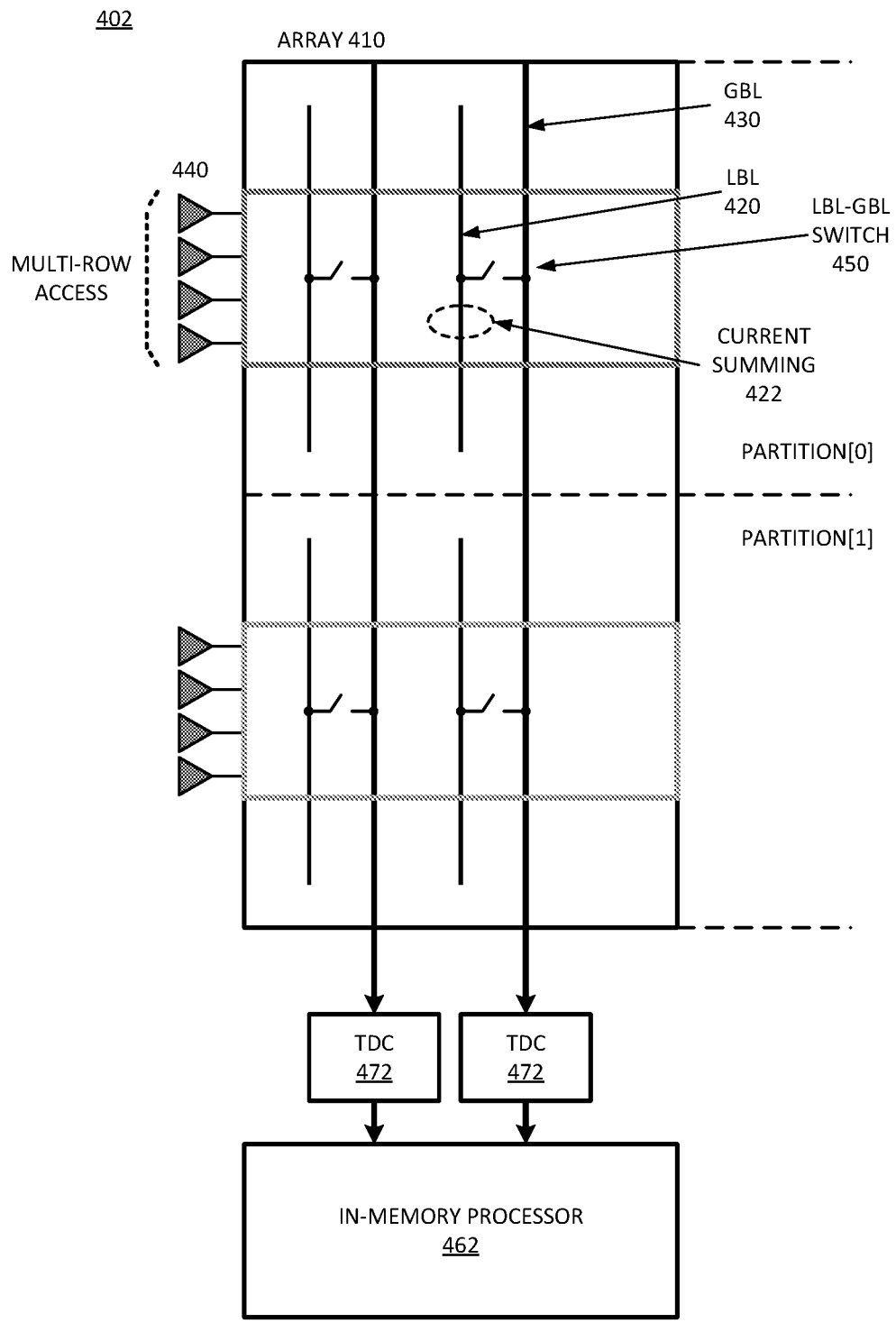
FIG. 4A is a block diagram of an example of multi-row access for a compute-in memory circuit with time-to-digital computation.

FIG. 4A is a block diagram of an example of multi-row access for a compute-in memory circuit with time-to-digital computation. System 402 represents CIM components in accordance with an example of system 100 of FIG. 1, or system 300 of FIG. 3. More specifically, system 402 provides an example of a partitioned CIM block with hierarchical global charge sharing bitlines.

In one example of a CIM block with column-major storage format, the system accesses multiple rows in a bit-positioned manner and performs current-summing on BLs to read multibit values per column. System 402 includes array 410, which represents a memory array or a CIM array. In one example, system 402 provides control signals from control hardware (not specifically shown) to perform multi-row access 440. With multi-row access 440, system 402 can access multiple rows per partition (e.g., as shown system 402 can access four rows in Partition[0] and four rows in Partition[1]). The row access can perform bit-serial multiplication per partition, with LBL 420 performing current summing, and GBL 430 performing charge-sharing and accumulation of the partial sum. LBL-GBL switch 450 represents a switch to selectively connect the local column circuitry and local column line to the global column circuitry including the column line. In one example, when the voltage is ready on LBL 420, for example, after a sufficient settling time after the discharging and access, system 402 triggers switch 450 to connect LBL 420 to GBL 430.

In one example, system 402 includes TDCs 472, which represent TDC cells or TDC blocks in accordance with any example provided. In one example, TDCs 472 are separate components from in-memory processor 462. As separate components, TDCs 472 can have different packaging from processor 462 and be connected to processor 462 via one or more signal lines. TDCs 472 convert a discharge time of the GBLs into a digital value that represents the value being computed for the functional read. It will be understood that the time to discharge digital value represents the value of the bitcells, or a product of the value of the bitcells with the incoming word.

In one example, system 402 performs multiplication with an operand X at in-memory processor 462. In one example, the multiplication operation is performed in a bit-serial fashion, where one-bit multiplication is mapped to an AND operation of the WL and one-bit input. In one example, to perform multiple bit-serial multiplications at the same functional read cycle, the CIM block of array 410 is partitioned into subarrays identified as Partition[0] and Partition[1]. The value generated by TDC 472 represents the time to discharge, which will correspond to the value of the product of the word in the array with the input word. Processing blocks of processor 462 can perform additional operations on the digital values provided by TDCs 472.

In one example, the operation of system 402 is in accordance with the following. System 400 activates multirow access 440 when an input word X operand bit is 1, otherwise it is deactivated. As such, the activation can perform the equivalent of a multiply operation, with a multiply by 1 when the bit is a 1, and a multiply by 0 by deactivating the WL when the bit is a 0. In such an implementation the WL access can inherently perform single bit multiplication. In one example, system 402 reads multiple bits per column via current summing on the precharged LBLs (such as LBL 420) by using bit-positioned pulse width modulation (PWM) on the WLs. For example, at LBL 420, array 410 provides multibit current summing at 422. In another example, at GBL 430, array 410 provides charge sharing 432.

Whether with PWM or some other operation that enables multibit read per column, system 402 connects LBLs to a shared and precharged GBL (such as GBL 430) through switches 450. In one example, switches 450 are CMOS pass gates. In one example, switches 450 are implemented as CMOS transmission gates. In one example, system 402 activates switches 450 simultaneously with deactivating the WLs, which results in a charge sharing operation on the GBLs, such as GBL 430. In one example, the charge sharing operation performs the addition operation for partial sum $Y\_psum = a*X_0[i] + b*X_1[i]$ for a given bit position i in the loop, per column. In one example, in-memory processor 462 performs shift and add operations across columns. Thus, for a bit length of input X vector N, system 402 can perform high throughput MAC operation within the CIM array in N functional-read clock cycles.

Figure 4B:
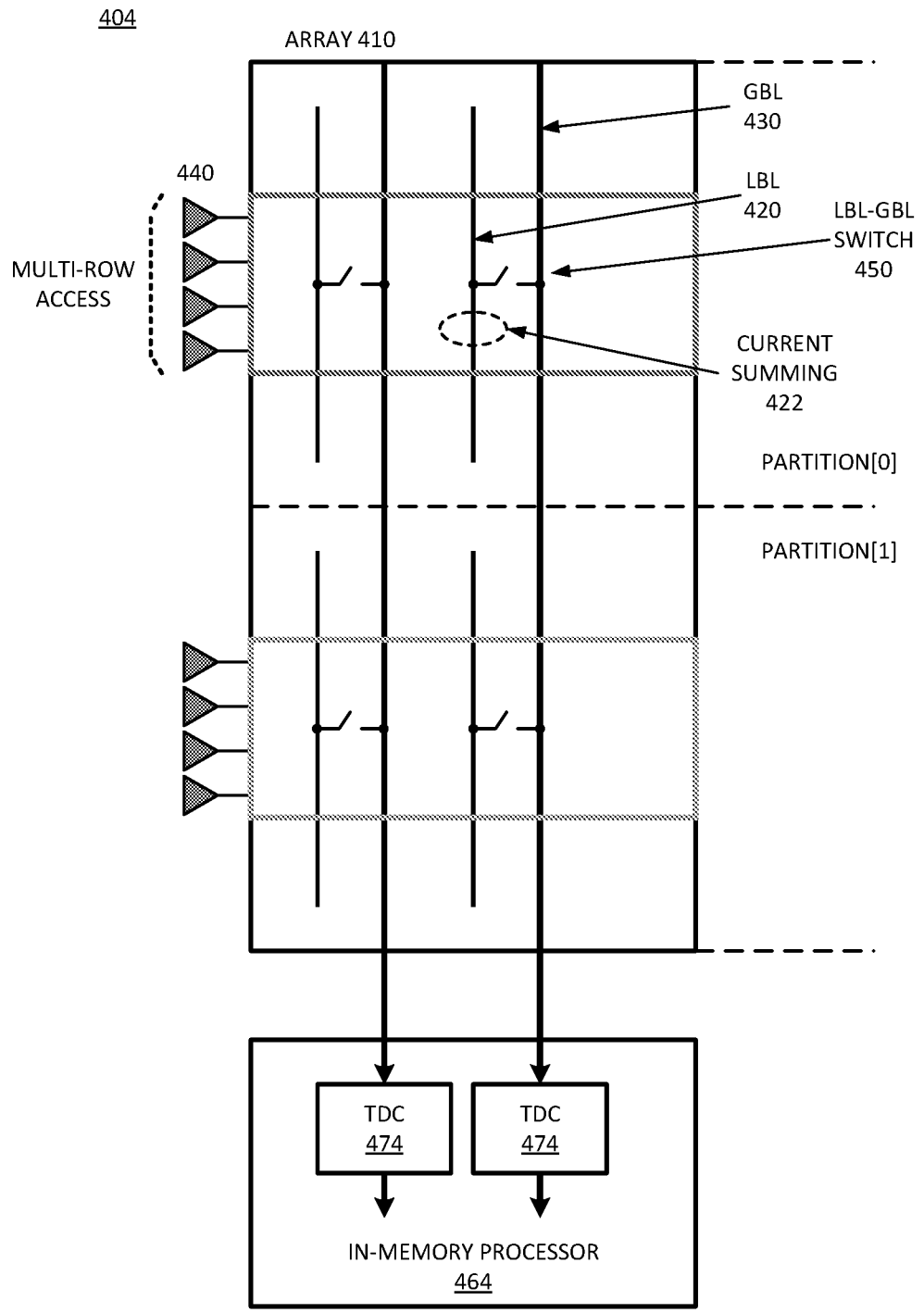
FIG. 4B is a block diagram of an example of a compute-in memory circuit that performs global charge sharing for multi-row access.

FIG. 4B is a block diagram of an example of a compute-in memory circuit that performs global charge sharing for multi-row access. System 404 represents CIM components as an alternative to system 402 of FIG. 4A. System 404 can be an example in accordance with system 100 of FIG. 1, or system 300 of FIG. 3. Components labeled with the same reference numerals as those of system 402 can be understood to share the descriptions above.

In one example, system 404 includes in-memory processor 464, which can be the same or similar to processor 462 of system 402, but with the addition of TDC cells within the processor itself. Thus, processor 464 includes TDCs 474, which represent TDC cells or TDC blocks in accordance with any example provided. In one example, TDCs 474 are part of in-memory processor 464. As part of the processor, processor 464 can be considered to sample the column line voltages, and apply the TDC components TDCs 472 to convert the discharge time to a digital value. TDCs 474 can be understood as sharing packaging with processor 464. In one example, TDCs 474 are integrated onto a common substrate as the processing components of processor 464. TDCs 474 enable processor 464 to operate on accumulated line voltages by converting the discharge time of the GBLs into a digital value that represents the value being computed for the functional read. It will be understood that the time to discharge digital value represents the value of the bitcells, or a product of the value of the bitcells with the incoming word. Processing blocks of processor 464 can perform additional operations on the digital values provided by TDCs 474.

Figure 5:
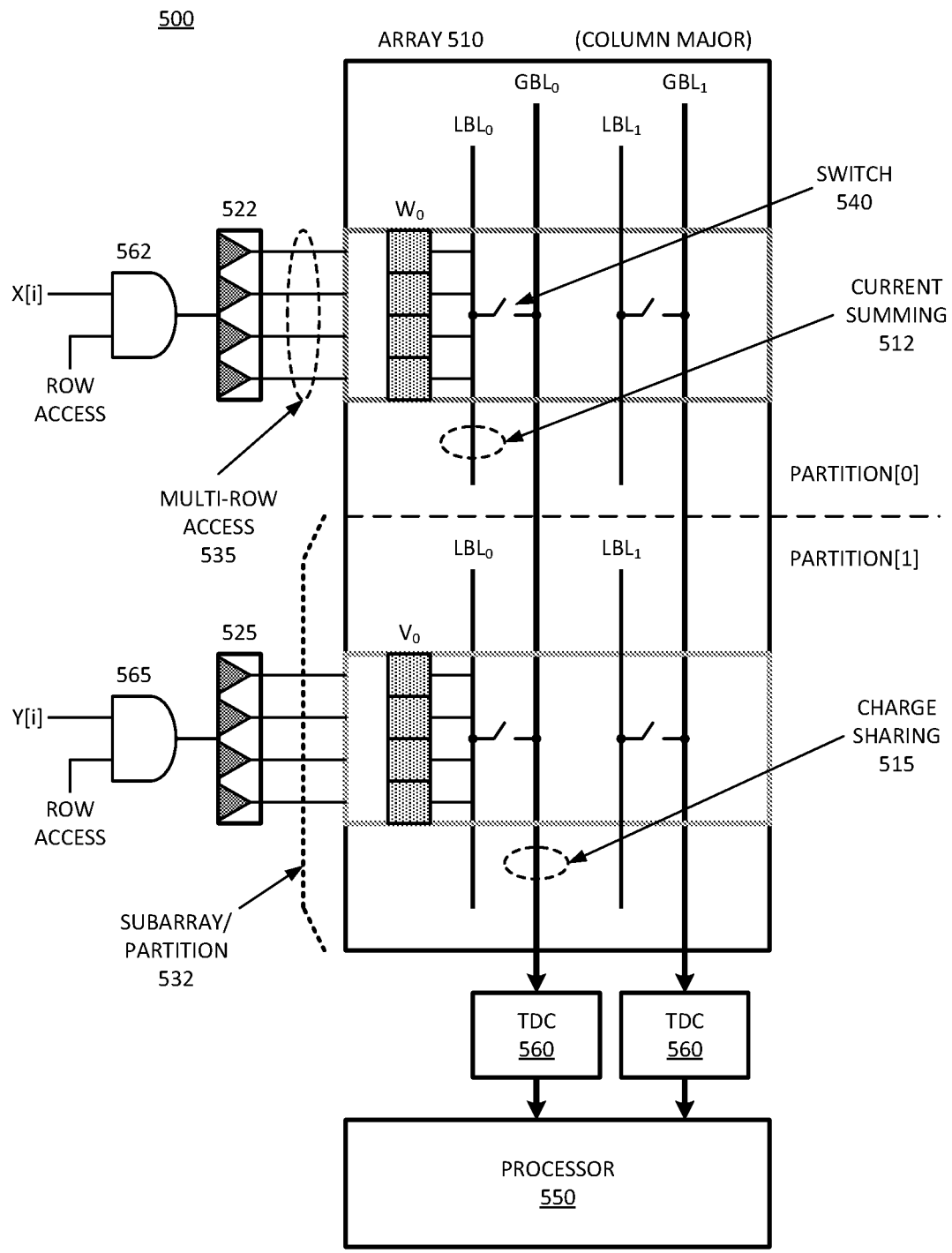
FIG. 5 is a block diagram of an example of a compute-in memory circuit that performs global charge sharing for multi-row access with a column major memory array.

FIG. 5 is a block diagram of an example of a compute-in memory circuit that performs global charge sharing for multi-row access with a column major memory array. System 500 represents a CIM block in accordance with an example of system 402 of FIG. 4A or system 404 of FIG. 4B. System 500 provides an example of a partitioned CIM block with hierarchical global charge sharing bitlines with data stored in column major format.

System 500 includes array 510 with data stored in column major format. In column major format, the consecutive bits of a word are stored at the same column address in different rows. In contrast, data in row major format has the consecutive bits of the word stored at the same row address in different columns.

Consider that each column stores N words. In one example, N=1 and a column stores a single word. In one example, N is greater than 1 and a column stores multiple words. It will be understood that in a computation on a word, the access control circuitry can access multiple WLs concurrently without accessing all bits of the word. Thus, computation on an entire word can include multiple operations involving the consecutive access of multiple rows in sequence until the computation is performed on the entire word. In one example, a word can be split to have portions stored in different partitions, and thus a word is not necessarily stored as a contiguous sequence of bits.

In one example, system 500 accesses multiple rows in a bit-positioned manner and performs current summing on BLs to read multibit values per column. System 500 includes array 510, which represents a CIM array. System 500 includes decoder hardware 522 for Partition[0] and decoder hardware 524 for Partition[1]. The dashed line pointed to by 532 illustrates a subarray or partition of array 510. In one example, for both Partition[0] and Partition[1], the control hardware of system 500 performs multi-row access 534. In one example, system 500 includes AND gate 562 to AND bits of word X[i] with a row access signal (such as the Row Control signal described above) to select the multiple rows of Partition[0] for the CIM operation.

Partition[0] includes $LBL_0$ and $LBL_1$, which represent local BLs that are local to Partition[0]. Partition[1] also includes $LBL_0$ and $LBL_1$, which represent local BLs that are local to Partition[1]. Although they are labeled the same, it will be understood that the local bitlines are local to a specific partition, and do not extend to the other partition. $LBL_0$ and $LBL_1$ (for both partitions) are selectively connectable to $GBL_0$ and $GBL_1$, respectively. The LBLs are selectively connected to the GBLs through switches 540. In one example, the LBLs enable current summing 512, as shown on $LBL_0$ of Partition[0]. In one example, the GBLs enable charge sharing 514, as shown on $GBL_0$.

In one example, system 500 accesses multiple rows in a bit-position weighted manner via local decoders per subarray (e.g., decoder 522 of Partition[0] and decoder 524 of Partition[1]). In one example, the local decoders are AND gated with the input operand vector bit (depicted as {X,Y} in system 500) to perform bit-serial multiplication with word W in Partition[0] and with word V in Partition[1], respectively. Bit serial multiplication can refer to driving the same bit of the operand vector on the multiple rows. In one example, each bit is binary weighted in accordance with the bit position of the row being driven. In one example, system 500 performs current summing 512 per subarray on the precharged LBLs, resulting in multiplication of the input vector bit and multibit functional read of a word, per subarray column. Switches 540 can selectively connect multiple LBLs to a shared and precharged GBL. In one example, when current summing is completed, by allowing sufficient time to have the voltage reach its voltage drop level ΔV for the read, system 500 deactivates the WLs and activates the global connection switches, connecting each LBL to the shared GBL per column.

In one example, after deactivating the WLs and connecting the LBLs to the GBL, the charge sharing operation on the GBLs results in a voltage on the GBL per column proportional to the resulting accumulation operation for a given bit position. The accumulation can include the bits from the bitcells as activated by the row access bits. In one example, TDCs 560 sample the GBLs after the functional read cycle is completed. More specifically, TDCs 560 detect the voltage on the GBLs and determine when the voltage on the GBL falls to a threshold voltage (e.g., a low voltage reference). Detection of discharge to the threshold triggers a control signal to cause the TDCs to sample the line and generate a digital output value representative of the time taken to discharge the GBL. The time to discharge in turn is based on the voltage accumulated on the GBL, which is caused by the multiplication of X with W and Y with V. In one example, TDC 560 provides the digital output to processor 550 to perform one or more shift operations or other operations or a combination of shift operations and other processing on data derived from the BLs.

In one example, processor 550 includes analog compute blocks. In one example, processor 550 only needs digital compute blocks based on receiving the digital values from TDCs 560. In one example, system 500 precharges all BLs again for the next functional read cycle. In one example, processor 550 performs processing operations to apply weighting to the computed bits based on a bit position of the bits, to align the functional read output with other bits or other processing operations.

In one example, for a given bit position i, the following are true: At Partition[0]:

$\Delta V\_LBL_0 \sim X[i] \cdot W_0$.

At Partition[1]:

$\Delta V\_LBL_0 \sim Y[i] \cdot V_0$.

Thus, for the two partitions, the voltage change on the LBL is proportional to the intersection of the operand vector bit value with the value of the bit stored in the storage cell. In one example, the value is further multiplied for relative position of the word by causing a multiplied charge for respective higher-order bits. Shifting to the left at the end of every functional-read enables multiplying the next higher bit position by 2, the next higher bit position by 4, and so forth. Charge-sharing the LBLs on the GBL results in a voltage proportional to the accumulation of all the LBLs voltages, with the pre-condition that LBL and GBL capacitances are known. In total, at the global level:

$V\_GBL_0 \sim X[i] \cdot W_0 + Y[i] \cdot V_0$.

Figure 6:
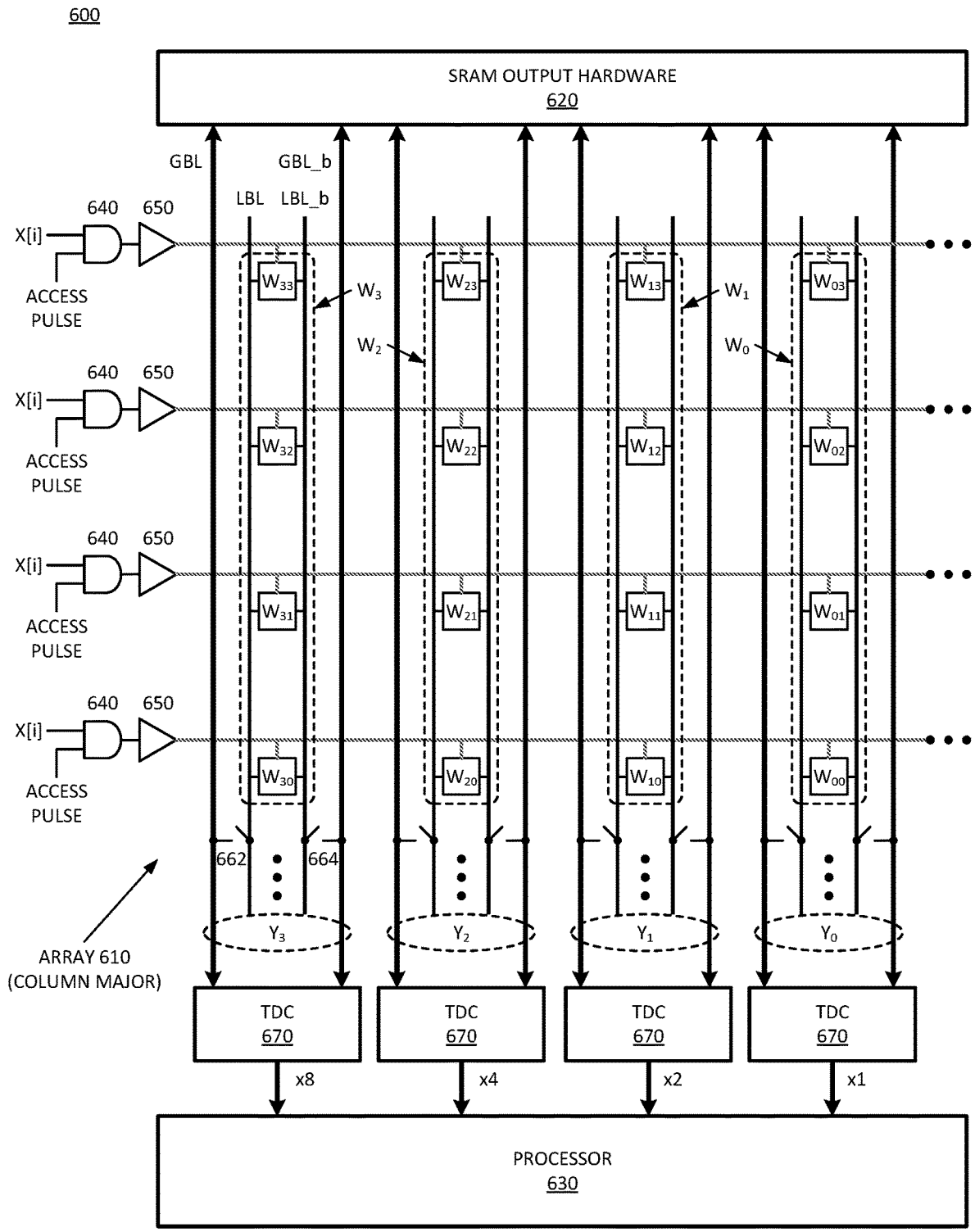
FIG. 6 is a block diagram of an example of a compute-in memory circuit that performs global charge sharing for multi-row access with a column major memory array and a differential bitline.

FIG. 6 is a block diagram of an example of a compute-in memory circuit that performs global charge sharing for multi-row access with a column major memory array and a differential bitline. System 600 is an example of a CIM array in accordance with an embodiment of system 500 of FIG. 5. System 600 illustrates elements of a memory array 610 with CIM circuitry, and it will be understood that the memory array includes more elements than what are shown. In one example, memory array 610 is an SRAM array.

System 600 includes SRAM output hardware 620, which represents hardware to precharge and sense the bitline bit values and provide a data read output. While the local bitlines are not explicitly illustrated as being connected to hardware 620, it will be understood that the bitlines are connected to circuitry to precharge the lines in preparation for a read. System 600 illustrates driver circuitry 650 to drive the wordlines, and AND gates 640 to selectively drive the WLs based on the operand vector X[i] and an access signal (Access Pulse).

The data is stored in array 610 in column major format. For system 600, assume that the MSB is the topmost WL, and the LSB is the bottommost WL. Also, the leftmost column is the most significant column, and the rightmost column is the least significant column. The reference numbers of the bit positions are to be understood as relative to each other and are not absolute positions. Thus, the leftmost column illustrated includes data word $W_3$, with bits [3:0] from top to bottom. For example, $W_3$ bit 3 is represented as $W_{33}$. The next column is $W_2$, then $W_1$, and finally $W_0$. Four columns are illustrated, but it is simply a representation and is not limiting or an indication of number of words or word size. The number of words and the length of the words can be different depending on the array size and system configuration.

In one example, array 610 includes differential bitlines. In one example, differential GBLs have corresponding differential LBLs. Thus, for example, the leftmost column illustrates LBL and LBL_b (the complement), selectively connected, respectively, to GBL and GBL_b. Switch 662 can selectively connect LBL to GBL, and switch 664 can selectively connect LBL_b to GBL_b. It will be understood that a differential bitline architecture can improve the ability of analog processor 630 to read or sense the bit value of the storage cells that make up array 610, given that the sensing can be performed as a comparison of the two lines that reduces the effects of noise. It will be understood that with a differential bitline, the storage cell will discharge to one bitline or the other depending on what is stored in the cell.

In an application of system 600 without TDCs 670, the access pulses can be binarily weighted based on bit position within the word. For example, different bit positions could be driven by longer or shorter pulses based on position within the word (e.g., the bit stored in $W_{33}$ has a relative value 8 times greater than the bit stored in $W_{30}$, and could be driven for a time period 8T relative to the period T used to drive $W_{30}$). However, in one example, with the use or TDCs 670, all rows can be driven by the same length of Access Pulse. The value read on the GBLs can be converted to a digital discharge value by TDCs 670, which provide the values to processor 630 for the application of weighting corresponding to bit position. Thus, processor 630 can track relative and absolute bit position of the bits of the computed words.

Thus, in one example of system 600, the CIM circuitry does not need to apply pulses of different width. With the use of different pulse lengths, the system is typically designed to use a minimum pulse width because of the binary weighting required for the longer pulses. With TDCs 670, system 600 can use a pulse width that does not require special control to be as short as possible, while still not requiring as much time to perform a functional read due to the fact that certain lines are not driven for weighted amounts of time. While the access is referred to as a "pulse," it will be understood that there is no special need for the shape of the access pulse when the system does not apply binary multiples. When multiples are applied, the system needs to control the pulse shape and length. With TDCs, the WLs can simply be driven up for a period of time which results in a sloping up of the voltage, and then the driving can be stopped. Such operation results in a simpler drive and control circuitry.

In one example, processor 630 performs final computations on Y to reach a final computation for the functional output. As illustrated, processor 630 can apply binary-weighting of incoming bits that drive WLs are reflected by shifting to the left at the end of every functional-read. Shifting to the left at the end of every functional-read enables multiplying the next higher bit position by 2, the next higher bit position by 4, and so forth.

Figure 7:
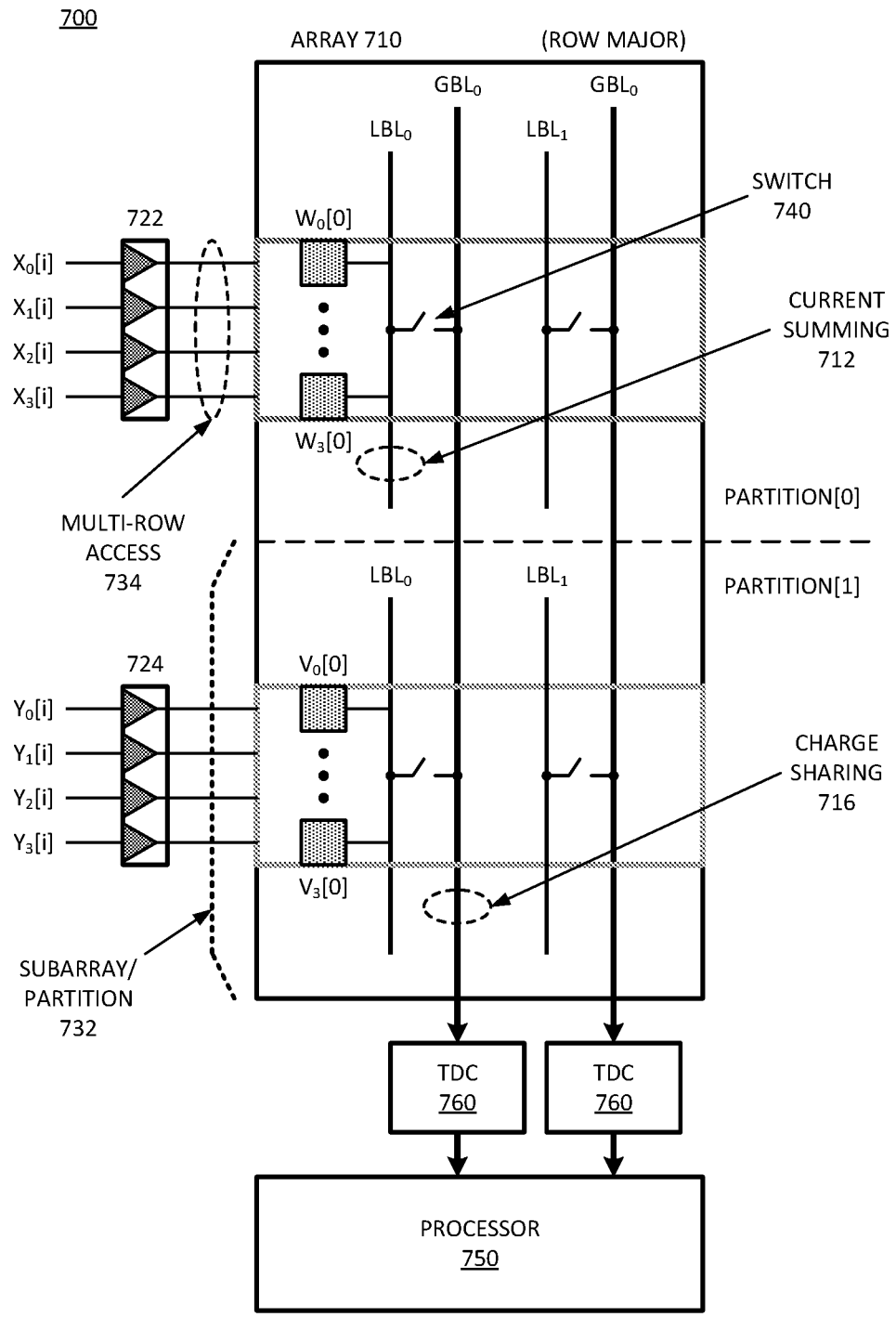
FIG. 7 is a block diagram of an example of a compute-in memory circuit that performs global charge sharing for multi-row access with a row major memory array.

FIG. 7 is a block diagram of an example of a compute-in memory circuit that performs global charge sharing for multi-row access with a row major memory array. System 700 represents a CIM block in accordance with an example of system 402 of FIG. 4A or system 404 of FIG. 4B. System 700 provides an example of a partitioned CIM block with hierarchical global charge sharing bitlines with data stored in row major format. System 700 includes array 710 with data stored in row major format. In row major format, the consecutive bits of a data word are stored at the same row address in different columns. In contrast, in column major format, the consecutive bits of a word are stored at the same column address in different rows.

Consider that each row stores N words. In one example, N=1 and a row stores a single word. In one example, N is greater than 1 and a row stores multiple words. In accordance with what is described, a computation with a CIM array can include multi-row access where multiple WLs are accessed simultaneously. In one example, the system can perform multi-row access and perform operations on different words concurrently. It will be understood that the computations can include access to sequences of columns to access the consecutive bits of the different words of the multiple rows concurrently.

In one example, system 700 accesses multiple rows. System 700 includes array 710, which represents a CIM array. System 700 includes decoder hardware 722 for Partition[0] and decoder hardware 724 for Partition[1]. The dashed line pointed to by 732 illustrates a subarray or partition of array 710. In one example, for both Partition[0] and Partition[1], the control hardware of system 700 performs multi-row access 734. In one example, system 700 provides bits of different words $X_N[i]$ to different rows of the multi-row access.

Thus, in one example in row major format, system 700 maps each WL access to a single input X bit being multiplied with L entries per row, where L is the length of the word. System 700 can perform multi-row access 734 via local decoders 722 and 724 per subarray. In one example, row or WL is activated or deactivated by bits of respective input vectors to perform bit-serial multiplication per row (depicted as $\{X_N i, Y_N i\}$ in system 700). System 700 illustrates that the top row of Partition[0] stores word $W_0$, down to the bottom row storing word $W_3$, corresponding with input vectors X[3:0]. For Partition[1] the top row stores word $V_0$, down to the bottom row storing word $V_3$, corresponding with input vectors Y[3:0].

Partition[0] includes $LBL_0$ and $LBL_1$, which represent local BLs that are local to Partition[0]. Partition[1] also includes $LBL_0$ and $LBL_1$, which represent local BLs that are local to Partition[1]. Although they are labeled the same, it will be understood that the local bitlines are local to a specific partition, and do not extend to the other partition. $LBL_0$ and $LBL_1$ (for both partitions) are selectively connectable to $GBL_0$ and $GBL_1$, respectively. The LBLs are selectively connected to the GBLs through switches 740. In one example, system 700 performs bit serial multiplication with words W[3:0] in Partition[0] and with words V[3:0] in Partition[1], respectively. Bit serial multiplication can refer to driving the corresponding bits of the operand vectors on the multiple rows.

In one example, the LBLs enable current summing 712, as shown on $LBL_0$ of Partition[0]. In one example, the GBLs enable charge sharing 714, as shown on $GBL_0$. It will be understood that current summing and charge sharing can be performed in the CIM array of system 700 similar to the CIM array of system 500 of FIG. 5. In one example, a difference with the row major format of system 700 is that both LBLs and GBLs perform partial sum addition.

The charge sharing for the sum addition creates a voltage on the BLs, which can be discharged with the time for discharge converted to a digital value by TDCs 760. In one example, TDCs 760 sample the GBLs after the functional read cycle is completed. More specifically, TDCs 760 detect the voltage on the GBLs and determine when the voltage on the GBL falls to a threshold voltage (e.g., a low voltage reference). Detection of discharge to the threshold triggers a control signal to cause the TDCs to sample the line and generate a digital output value representative of the time taken to discharge the GBL. The time to discharge in turn is based on the voltage accumulated on the GBL, which is caused by the multiplication of X with W and Y with V. In one example, TDC 760 provides the digital output to processor 750 to perform one or more shift operations or other operations or a combination of shift operations and other processing on data derived from the BLs.

In one example, processor 750 includes analog compute blocks. In one example, processor 750 only needs digital compute blocks based on receiving the digital values from TDCs 760. In one example, system 700 precharges all BLs again for the next functional read cycle. In one example, processor 750 performs processing operations to apply weighting to the computed bits based on a bit position of the bits, to align the functional read output with other bits or other processing operations. In one example, system 700 precharges all BLs again for the next functional read cycle.

In one example, for a given bit position i, the following are true: At Partition[0]:

$$\Delta V\_LBL_0 \sim \sum_{j=0}^{3} X_j[i] \cdot W_j[0].$$

At Partition[1]:

$$\Delta V\_LBL_0 \sim \sum_{j=0}^{3} Y_j[i] \cdot V_j[0].$$

Thus, for the two partitions, the voltage change on the LBL is proportional to the sum of the intersections of the operand vector bit values with the values of the bits stored in the storage cells. In total, at the global level:

$$\Delta V\_GBL_0 \sim \sum_{j=0}^{3} (X_j[i] \cdot W_j[0] + Y_j[i] \cdot V_j[0]).$$

Processor 750 can be configured to understand these relationships of the charges and perform operations to perform the final computation for the functional read output. It will be appreciated that processor 750 can also handle bit carry-over from multiple partial results to another if needed.

Figure 8:
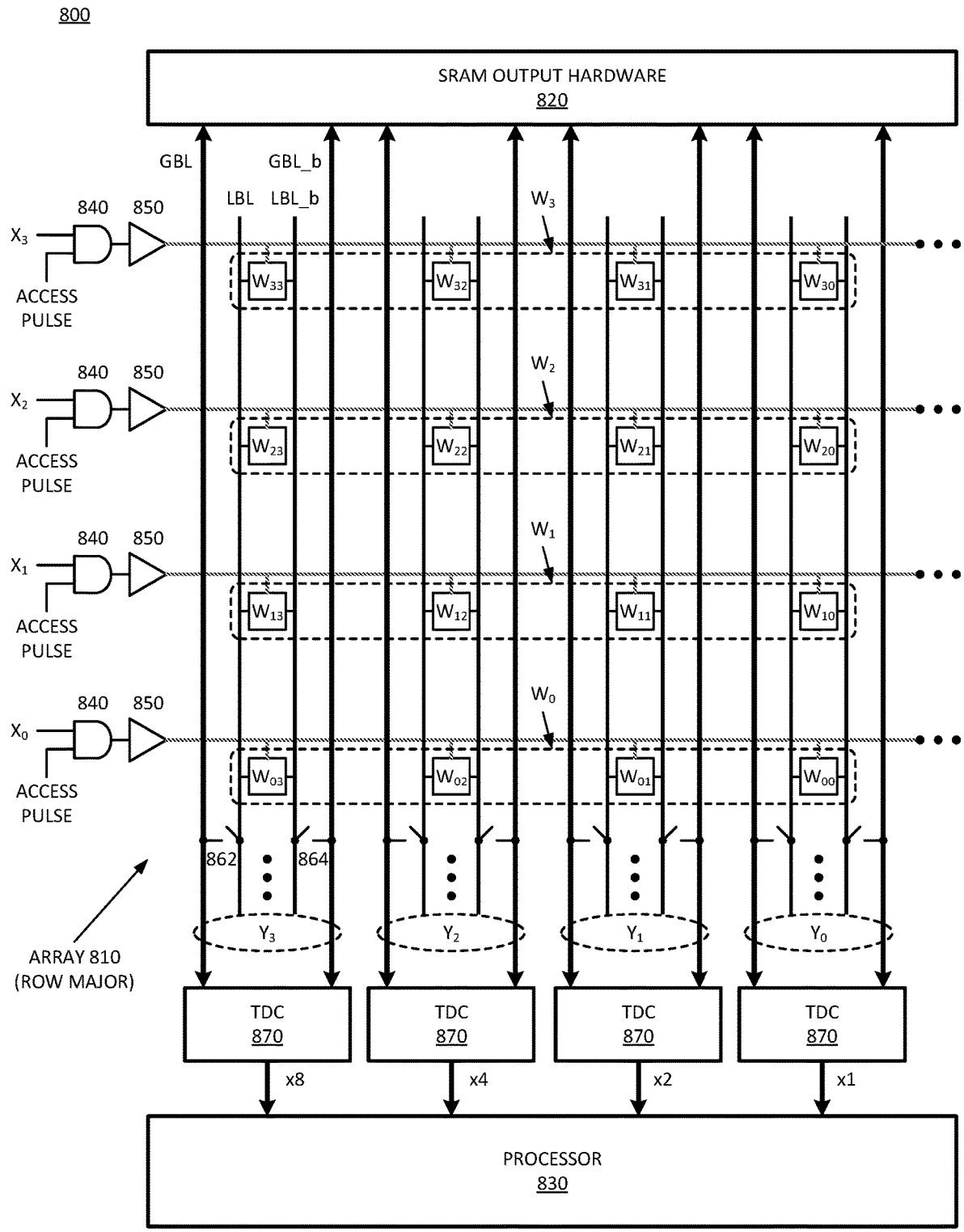
FIG. 8 is a block diagram of an example of a compute-in memory circuit that performs global charge sharing for multi-row access with a row major memory array and a differential bitline.

FIG. 8 is a block diagram of an example of a compute-in memory circuit that performs global charge sharing for multi-row access with a row major memory array and a differential bitline. System 800 is an example of a CIM array in accordance with an embodiment of system 700 of FIG. 7. System 800 illustrates elements of a memory array 810 with CIM circuitry, and it will be understood that the memory array includes more elements than what are shown. In one example, memory array 810 is an SRAM array.

System 800 includes SRAM output hardware 820, which represents hardware to precharge and sense the bitline bit values and provide a data read output. While the local bitlines are not explicitly illustrated as being connected to hardware 820, it will be understood that the bitlines are connected to circuitry to precharge the lines in preparation for a read. System 800 illustrates driver circuitry 850 to drive the wordlines, and AND gates 840 to selectively drive the WLs based on the operand vector X[i] and an access signal (Access).

The data is stored in array 810 in row major format. For system 800, assume that the leftmost column is the most significant bit, and the rightmost column is the least significant bit. The reference numbers of the bit positions are to be understood as relative to each other and are not absolute positions. The topmost WL is designated as data word $W_3$, with bits [3:0] from left to right. For example, $W_3$ bit 3 is represented as $W_{33}$. The next column is $W_3[2]$ designated as $W_{32}$, then $W_3[1]$ designated as $W_{31}$, and finally $W_3[0]$ designated as $W_{30}$. The four words W[3:0] are not necessarily in any significance, but are simply labeled 3 to 0 to designate different words, and the relative value of the numbers does not necessarily indicate anything about the significance or order of the data words. Four columns are illustrated, but it is simply a representation and is not limiting or an indication of number of words or word size. The number of words and the length of the words can be different depending on the array size and system configuration. A row can store a single word, or multiple words. A word can be a binary weight, or a multibit weight.

In one example, array 810 includes differential bitlines. In one example, differential GBLs have corresponding differential LBLs. Thus, for example, the leftmost column illustrates LBL and LBL_b (the complement), selectively connected, respectively, to GBL and GBL_b. Switch 862 can selectively connect LBL to GBL, and switch 864 can selectively connect LBL_b to GBL_b. It will be understood that a differential bitline architecture can improve the ability of processor 830 to read or sense the bit value of the storage cells that make up array 810, given that the sensing can be performed as a comparison of the two lines that reduces the effects of noise. It will be understood that with a differential bitline, the storage cell will discharge to one bitline or the other depending on what is stored in the cell.

In one example, with the use or TDCs 870, all rows can be driven by the same length of Access Pulse, similar to what is described for system 600. The value read on the GBLs can be converted to a digital discharge value by TDCs 870, which provide the values to processor 830 for the application of weighting corresponding to bit position. Thus, processor 830 can track relative and absolute bit position of the bits of the computed words.

Thus, in one example of system 800, the CIM circuitry does not need to apply pulses of different width. With the use of different pulse lengths, the system is typically designed to use a minimum pulse width because of the binary weighting required for the longer pulses. With TDCs 870, system 800 can use a pulse width that does not require special control to be as short as possible, while still not requiring as much time to perform a functional read due to the fact that certain lines are not driven for weighted amounts of time. While the access is referred to as a "pulse," it will be understood that there is no special need for the shape of the access pulse when the system does not apply binary multiples. When multiples are applied, the system needs to control the pulse shape and length. With TDCs, the WLs can simply be driven up for a period of time which results in a sloping up of the voltage, and then the driving can be stopped. Such operation results in a simpler drive and control circuitry.

In one example, processor 830 performs final computations on Y to reach a final computation for the functional output. As illustrated, processor 830 can apply binary-weighting of incoming bits that drive WLs are reflected by shifting to the left at the end of every functional-read. Shifting to the left at the end of every functional-read enables multiplying the next higher bit position by 2, the next higher bit position by 4, and so forth.

Figures 9, 10:
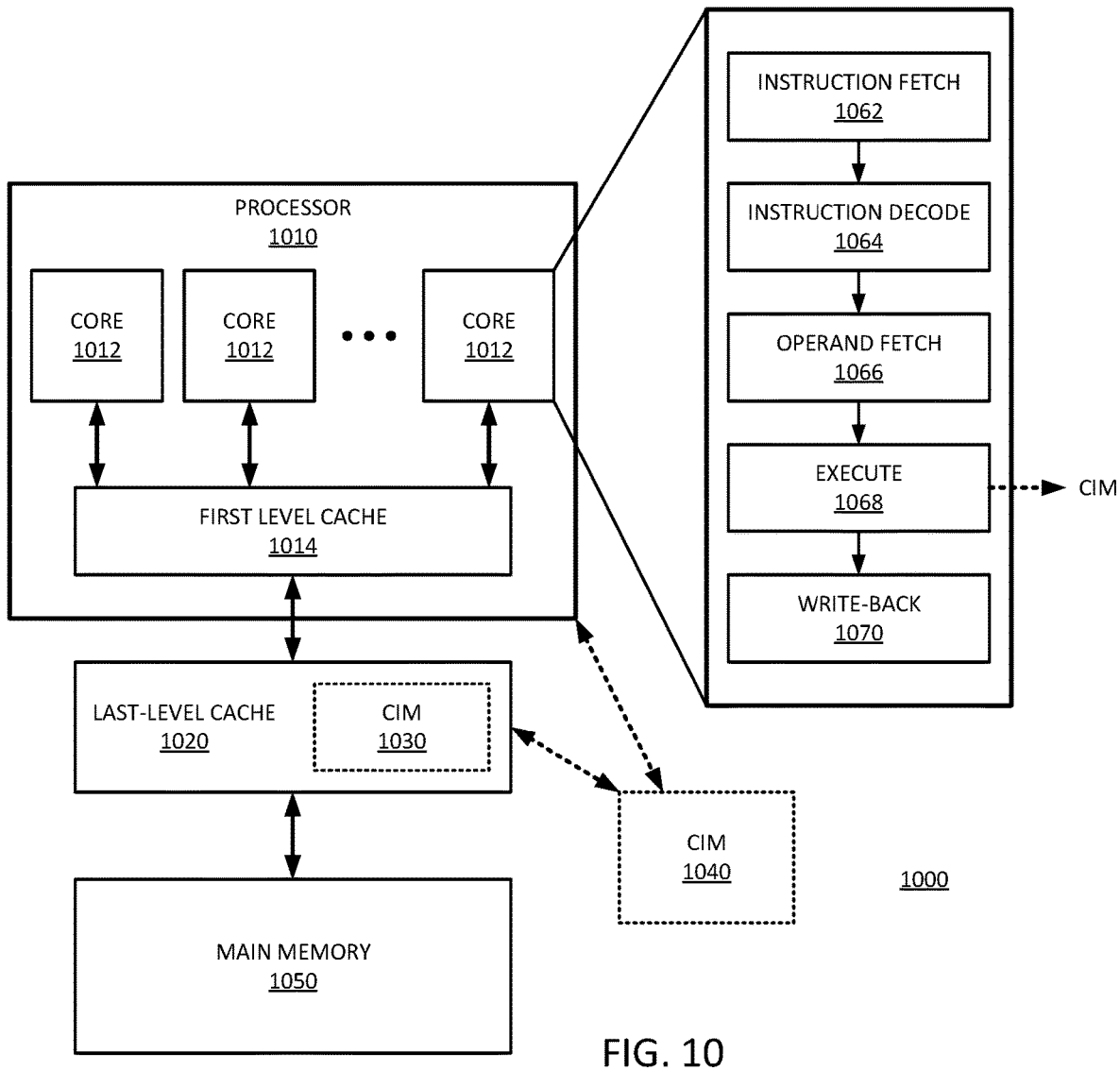
FIG. 9 is an example of code for bit-serial multiply-accumulate operation for a compute-in memory circuit.
FIG. 10 is a block diagram of an example of a system with a processor and a compute-in memory circuit with time-to-digital computation.

FIG. 9 is an example of code for bit-serial multiply-accumulate operation for a compute-in memory circuit. Code 900 provides one example of a code representation of bit serial multiply accumulate, which can be executed by CIM circuits described. Code 900 is an example of a bit serial multiply operation based MAC operation for an example case for $Y=a*X_0+b*X_1.$ In one example, a logically equivalent expression Y is achieved by using an iterative loop where the X vector is multiplied bit by bit, starting from the MSB. Such an iterative bit serial approach makes the multiply equivalent to a logical AND operation.

At line 902, the code defines variable i=bit_length(X)–1, which variable can be used to iterate through the code for all bits in the vector operand X. At line 904, the code defines variable Y, initialized to zero (i.e., reset to 0). Y can be initialized to any value less than, more than, or equal to zero, before a new accumulation. At line 906 the loop is defined, and the code will loop for (i>=0) to cover all bits of X.

At every iteration for bit position i, single bit X vector operands are multiplied with multibit words {a, b}, and accumulated in a partial sum. At line 908, Y is set equal to an accumulation of a times $X_0[i]$ plus b time $X_1[i]$, or:

$Y+=a*X_0+b*$

In one example, the value computed is based on a discharge time generated by a TDC cell in accordance with any description herein. In one example, the partial sum is shifted by one bit to left and the bit position index is decremented by one. At line 910, Y is set equal to the value computed above, shifted to the left:

$Y=Y<<LeftShift\_by\_1.$

At line 912, the value of i is decremented. The process is repeated until the bit position index reaches the LSB of {X0, X1}, where the final Y value is computed. Alternatively, the same operation can be done by starting at the LSB, and then increasing the bit position index by one at every iteration until MSB is reached, and by shifting to right. At line 914, the loop ends.

Bit serial operation can be understood as an operation that processes input activations one bit at a time. Bit serial operation has lower readout precision requirements as compared to multibit activations, which reduces the analog logic design effort. For example, for 4-bit weights, 4 subarrays, and 16-bit input operands, GBL sampling can be accomplished with 6-bit resolution before the shift operation using bit serial operation. This is true even if the final accumulated Y value is 16-bits in length.

FIG. 10 is a block diagram of an example of a system with a processor and a compute-in memory circuit with time-to-digital computation. System 1000 can include a CIM circuit in accordance with any example described above. While not specifically illustrated, the CIM circuit includes TDC cells to generate functional read partial values as digital outputs based on a discharge time of the CIM column line. The TDC and operation of the CIM circuit with the TDC can be in accordance with any description herein. The CIM circuit can be a CIM accelerator for machine learning or other compute-intensive operation. An accelerator can be referred to as a coprocessor. In one example, the CIM circuitry provides a neural network infrastructure for computation of an artificial intelligence application.

System 1000 includes processor 1010, which can be or include a general purpose CPU (central processing unit), a GPU (graphics processing unit), a DSP (digital signal processor) array, or other processor. Processor 1010 represents a digital processor and can be referred to as a host processor. In one example, processor 1010 includes multiple cores 1012. Processor 1012 executes applications or software programs that access data for compute-intensive operations.

In one example, processor 1010 includes first level cache 1014, which represents caching resources within the processor die or processor SOC (system on a chip) that provides physically close storage resources for hot data. In one example, processor 1010 includes multiple levels of on-chip/local cache, which are not explicitly shown. It will be understood that cache resources can be local to a specific core 1012, shared by multiple cores 1012, or a combination of shared cache resources and localized cache resources.

System 1000 includes last-level cache 1020. In one example, last level cache 1020 is also on processor 1010. In one example, last level cache 1020 is off-chip from processor 1010. Last level cache 1020 is larger than first level cache 1014 but takes longer to access. There may be any number of other cache layers between first level cache 1014 and last level cache 1020.

Main memory 1050 represents system main memory. Main memory 1050 is typically orders of magnitude larger than the cache resources, but takes much longer to access relative to the cache resources. Main memory 1050 can include volatile memory resources that have indeterminate state when power is interrupted. Main memory 1050 can include nonvolatile memory resources that maintain state even when power is interrupted to the memory. Caching resources are typically volatile, but can include nonvolatile memory resources.

System 1000 includes a depiction of an instruction execution pipeline for core 1012. In one example, each core 1012 can include multiple execution pipelines (e.g., multithreading). The instruction pipeline is to be understood as a general explanation, and specific details are not provided. In one example, the instruction pipeline includes instruction fetch 1062 where the core fetches the instruction to execute. Instruction decode 1064 represents the decoding of the instruction by the core in preparation of the processor circuitry for execution. In one example, instruction decode 1064 identifies the instruction as part of a command that triggers use of a CIM circuit for operation.

Operand fetch 1066 represents the fetching or obtaining of the operands to be executed on for the instruction. In one example, the operand is a weight vector for a neural network, or other math function operand. In one example, the operands are in or are placed in register space associated with the execution pipeline. Execute 1068 represents execution of the instruction on or with the operand(s). In one example, execution can include sending of the operation to CIM circuitry for execution. In one example, the instruction is sent to a processor ALU, which can trigger the execution by the CIM accelerator. Write-back 1070 refers to writing execution results in a results register for return to memory, or for passing to another register for another execution. In the case of use of CIM circuitry, execution 1068 and write-back 1070 can include sending the operation to CIM circuitry, which will execute the operation and return a functional output, which can then be written back. Thus, the instruction that would traditionally require loading operands into an ALU or other computation engine within processor 1010 can be sent to the CIM circuitry without having to read from memory, and then receiving a computation result from the CIM circuitry instead of from the local computation engine.

CIM 1030 represents CIM circuitry implemented in last level cache 1020. CIM 1030 can be all or part of last level cache 1020. In one example, last level cache 1020 includes a memory array configured as a CIM circuit, and a memory array that does not include CIM circuitry. The system can selectively store data in the CIM-enabled memory array for CIM acceleration.

CIM 1040 represents CIM circuitry that is separate from the cache architecture of system 1000. Thus, CIM 1040 represents a memory resource that is dedicated to the execution of CIM accelerated operations. Such a CIM memory can still include traditional access hardware to enable reading from the memory without performing a computation. CIM 1030 and CIM 1040 include CIM hardware to enable functional reads in accordance with any example described herein.

CIM 1030 and CIM 1040 include access paths from processor 1010. When part of the cache architecture as CIM 1030, the interconnection hardware can be the same as interconnection hardware for the cache devices. When not part of the cache architecture as CIM 1040, the CIM interconnection can be similar or the same as a cache device, or main memory device, or other memory coupled to processor 1010. CIM 1030 and CIM 1040 are coupled to main memory 1050 (not specifically shown) to load operands for CIM acceleration operations.

In one example, invocation of a compute-intensive function triggers directing commands to the CIM accelerator. For example, processor 1010 can include support in its instruction set architecture (ISA) for certain commands to trigger operation of a CIM accelerator. In one example, invocation of the CIM accelerator can be preceded by or associated with the loading of configuration information into accelerator. Such configuration information can, for example, define weights of internodal connections, define math functions to be performed, or other configuration. System 1000 can load configuration information from system main memory or from nonvolatile mass storage, or a combination.

In one example, the CIM circuitry of either CIM 1030 or CIM 1040, or both, can include one or more levels of a neural network. In one example, after configuration of the CIM circuitry, the instruction pipeline applies input values to the configured neural network for processing. The CIM circuitry generates a resultant to write back to register space or system memory and the CIM circuitry can indicate completion of the processing to the executing thread that invoked the CIM circuitry. In one example, if the number of neural network levels or neurons per level that are physically implemented in the CIM circuitry is less than the number of levels/neurons of the neural network to be processed, the processing through the neural network can be iterated by repeatedly loading the CIM circuitry for processing until all levels of the neural network have been processed.

Figure 11:
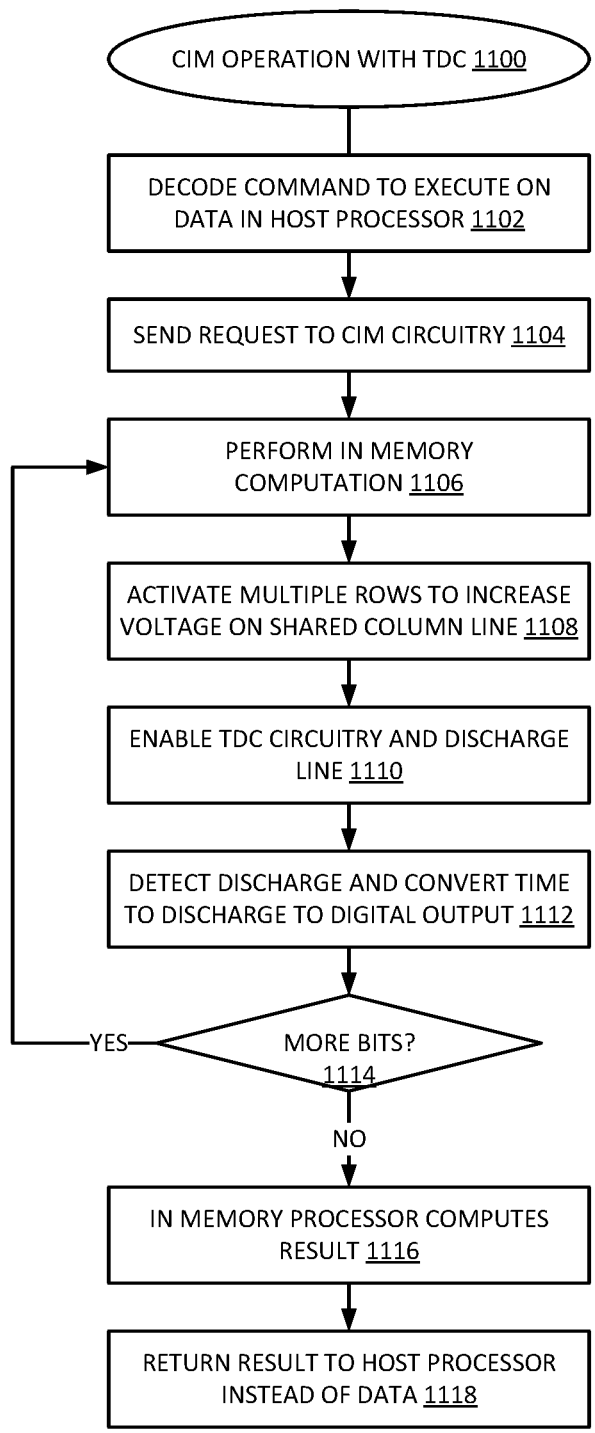
FIG. 11 is a flow diagram of an example of a process for in-memory computation with a time-to-digital circuit.

FIG. 11 is a flow diagram of an example of a process for in-memory computation with a time-to-digital circuit. Process 1100 represents a process for CIM operation with a TDC by an example of a system with CIM circuitry in accordance with what is described herein. In one example, a hardware processor or control logic for the processor decodes a command for execution of an instruction on data, block 1102.

In one example, the processor logic identifies the command as a command that can be accelerated with CIM circuitry and sends a request with the instruction to the CIM circuitry, block 1104. CIM circuitry can accelerate any operation that involves multiple or accumulate operations, or both, with many sequential computations. By using CIM circuitry, the data does not have to be transferred between the memory and processor, but the computation can occur at the memory, accelerating the operation while reducing the energy consumption. By using a TDC in the CIM circuitry, the functional read operation can operate in the time domain for sensing of the voltage on the BLs instead of operating in the voltage domain with limited headroom.

In one example, the CIM circuitry performs in-memory computation operations as an iteration of multiple computations, starting at block 1106. In one example, the CIM circuitry activates multiple rows simultaneously, which increases the voltage on a shared column line, block 1108. In one example, the CIM circuitry enables TDC circuitry and discharges the column line, block 1110. The TDC detects the discharge of the column line and converts the time to discharge to a digital output value, block 1112. The discharge time will be affected by the value of the bits stored in the bitcells, or by the value of the bits in the bitcells as multiplied by an input word used to drive the rows.

After the computation operations if there are more bits to process in the operand of the instruction, block 1114 YES branch, process 1100 returns to block 1106 for another iteration. If there are no more bits to process, block 1114 NO branch, an in memory processor finalizes a result, block 1116. The in memory processor operates on the digital value provided by the TDC circuitry. In one example, the in memory processor performs shift operations on the digital value. Eventually the analog processor converts the result into a digital value to return as a result. The processor returns a functional read result to the host processor that invoked the CIM circuitry, instead of returning data for computation by the host processor, block 1118.

Figure 12:
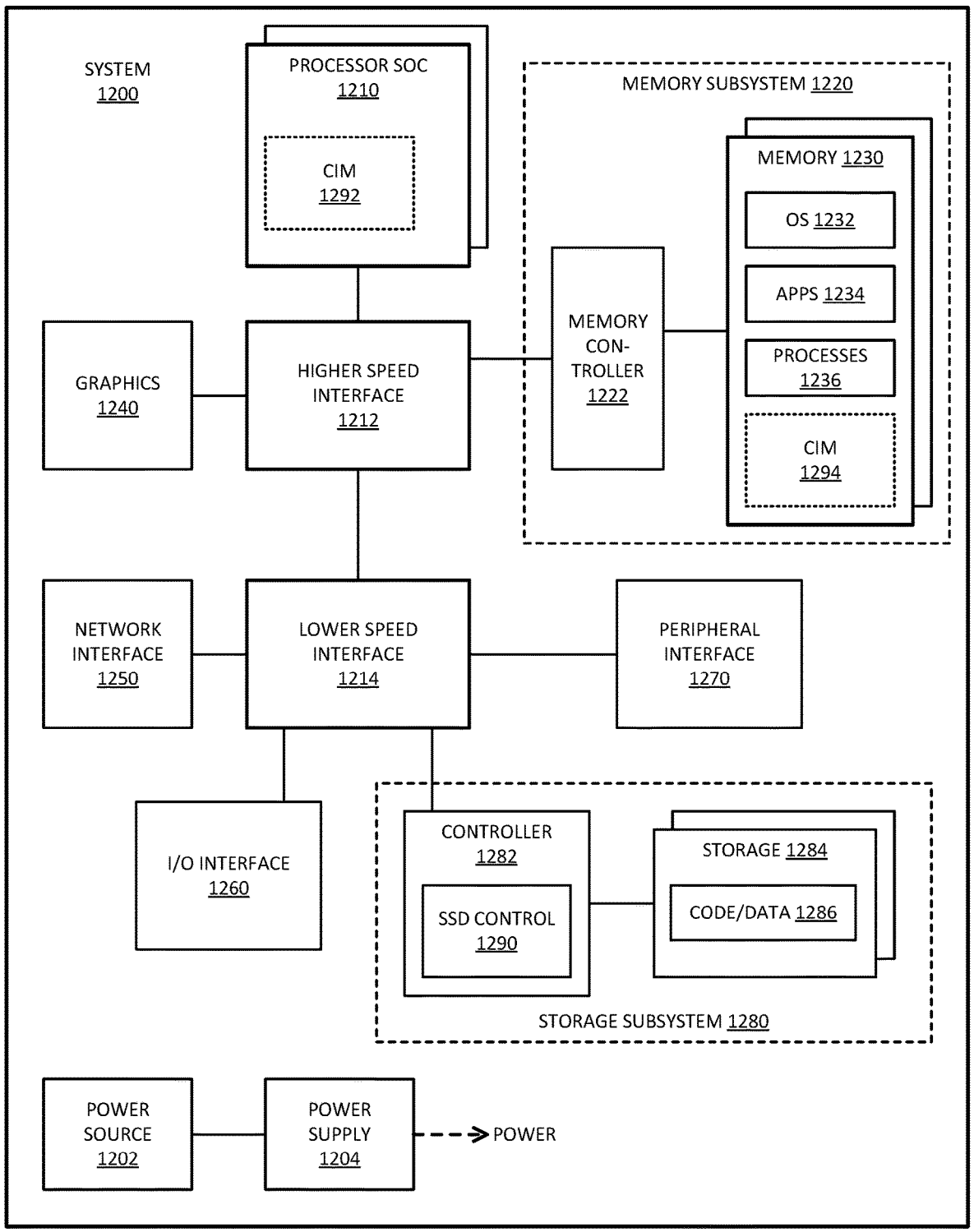
FIG. 12 is a block diagram of an example of a computing system in which compute-in-memory (CIM) operations with a time-to-digital circuit can be implemented.

FIG. 12 is a block diagram of an example of a computing system in which compute-in-memory (CIM) operations with a time-to-digital circuit can be implemented. System 1200 represents a computing device in accordance with any example herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

In one example, system 1200 includes CIM circuitry. The CIM circuitry can be in accordance with any example described herein. One example of CIM circuitry can be CIM 1292, which is represented as CIM circuitry included in processor SOC 1210. CIM 1292 can be or include CIM circuitry in a memory device on the processor SOC substrate or die. For example, CIM 1292 can be a cache or a portion of a cache on processor SOC 1210. Another example of CIM circuitry can be CIM 1294, which is represented as CIM circuitry included in memory subsystem 1220. More specifically, CIM 1294 is illustrated as part of memory 1230, referring to the memory resources of system 1200. CIM 1294 represents CIM circuitry that can be included as a memory resource to which processor SOC 1210 can offload compute-intensive operations. In one example, the memory arrays of either CIM 1292 or CIM 1294 can be dedicated to storing data for CIM acceleration. In one example, CIM 1292 or CIM 1294 are used as regular memory resources, and can also help with CIM acceleration. CIM circuitry 1292 or 1294, or both, include TDCs to measure discharge time of the memory array columns and provide a digital TDC value to an in-memory processor of the CIM circuitry.

System 1200 includes processor SOC 1210 (referred to subsequently as "processor 1210"), which provides processing, operation management, and execution of instructions for system 1200. Processor 1210 can include any type of microprocessor, central processing unit (CPU), graphics processing unit (GPU), processing core, or other processing hardware to provide processing for system 1200, or a combination of processors. Processor 1210 controls the overall operation of system 1200, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1200 includes interface 1212 coupled to processor 1210, which can represent a higher speed interface or a high throughput interface for system components that needs higher bandwidth connections, such as memory subsystem 1220 or graphics interface components 1240. Interface 1212 represents an interface circuit, which can be a standalone component or integrated onto a processor die. Where present, graphics interface 1240 interfaces to graphics components for providing a visual display to a user of system 1200. In one example, graphics interface 1240 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one example, the display can include a touchscreen display. In one example, graphics interface 1240 generates a display based on data stored in memory 1230 or based on operations executed by processor 1210 or both. In one example, graphics interface 1240 generates a display based on data stored in memory 1230 or based on operations executed by processor 1210 or both.

Memory subsystem 1220 represents the main memory of system 1200, and provides storage for code to be executed by processor 1210, or data values to be used in executing a routine. Memory subsystem 1220 can include one or more memory devices 1230 such as read-only memory (ROM), flash memory, one or more varieties of random access memory (RAM) such as DRAM, or other memory devices, or a combination of such devices. Memory 1230 stores and hosts, among other things, operating system (OS) 1232 to provide a software platform for execution of instructions in system 1200. Additionally, applications 1234 can execute on the software platform of OS 1232 from memory 1230. Applications 1234 represent programs that have their own operational logic to perform execution of one or more functions. Processes 1236 represent agents or routines that provide auxiliary functions to OS 1232 or one or more applications 1234 or a combination. OS 1232, applications 1234, and processes 1236 provide software logic to provide functions for system 1200. In one example, memory subsystem 1220 includes memory controller 1222, which is a memory controller to generate and issue commands to memory 1230. It will be understood that memory controller 1222 could be a physical part of processor 1210 or a physical part of interface 1212. For example, memory controller 1222 can be an integrated memory controller, integrated onto a circuit with processor 1210.

While not specifically illustrated, it will be understood that system 1200 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 1200 includes interface 1214, which can be coupled to interface 1212. Interface 1214 can be a lower speed interface than interface 1212. In one example, interface 1214 represents an interface circuit, which can include standalone components and integrated circuitry. In one example, multiple user interface components or peripheral components, or both, couple to interface 1214. Network interface 1250 provides system 1200 the ability to communicate with remote devices (e.g., servers or other computing devices) over one or more networks. Network interface 1250 can include an Ethernet adapter, wireless interconnection components, cellular network interconnection components, USB (universal serial bus), or other wired or wireless standards-based or proprietary interfaces. Network interface 1250 can exchange data with a remote device, which can include sending data stored in memory or receiving data to be stored in memory.

In one example, system 1200 includes one or more input/output (I/O) interface(s) 1260. I/O interface 1260 can include one or more interface components through which a user interacts with system 1200 (e.g., audio, alphanumeric, tactile/touch, or other interfacing). Peripheral interface 1270 can include any hardware interface not specifically mentioned above. Peripherals refer generally to devices that connect dependently to system 1200. A dependent connection is one where system 1200 provides the software platform or hardware platform or both on which operation executes, and with which a user interacts.

In one example, system 1200 includes storage subsystem 1280 to store data in a nonvolatile manner. In one example, in certain system implementations, at least certain components of storage 1280 can overlap with components of memory subsystem 1220. Storage subsystem 1280 includes storage device(s) 1284, which can be or include any conventional medium for storing large amounts of data in a nonvolatile manner, such as one or more magnetic, solid state, or optical based disks, or a combination. Storage 1284 holds code or instructions and data 1286 in a persistent state (i.e., the value is retained despite interruption of power to system 1200). Storage 1284 can be generically considered to be a "memory," although memory 1230 is typically the executing or operating memory to provide instructions to processor 1210. Whereas storage 1284 is nonvolatile, memory 1230 can include volatile memory (i.e., the value or state of the data is indeterminate if power is interrupted to system 1200). In one example, storage subsystem 1280 includes controller 1282 to interface with storage 1284. In one example controller 1282 is a physical part of interface 1214 or processor 1210, or can include circuits or logic in both processor 1210 and interface 1214.

Power source 1202 provides power to the components of system 1200. More specifically, power source 1202 typically interfaces to one or multiple power supplies 1204 in system 1200 to provide power to the components of system 1200. In one example, power supply 1204 includes an AC to DC (alternating current to direct current) adapter to plug into a wall outlet. Such AC power can be renewable energy (e.g., solar power) power source 1202. In one example, power source 1202 includes a DC power source, such as an external AC to DC converter. In one example, power source 1202 or power supply 1204 includes wireless charging hardware to charge via proximity to a charging field. In one example, power source 1202 can include an internal battery or fuel cell source.

Figure 13:
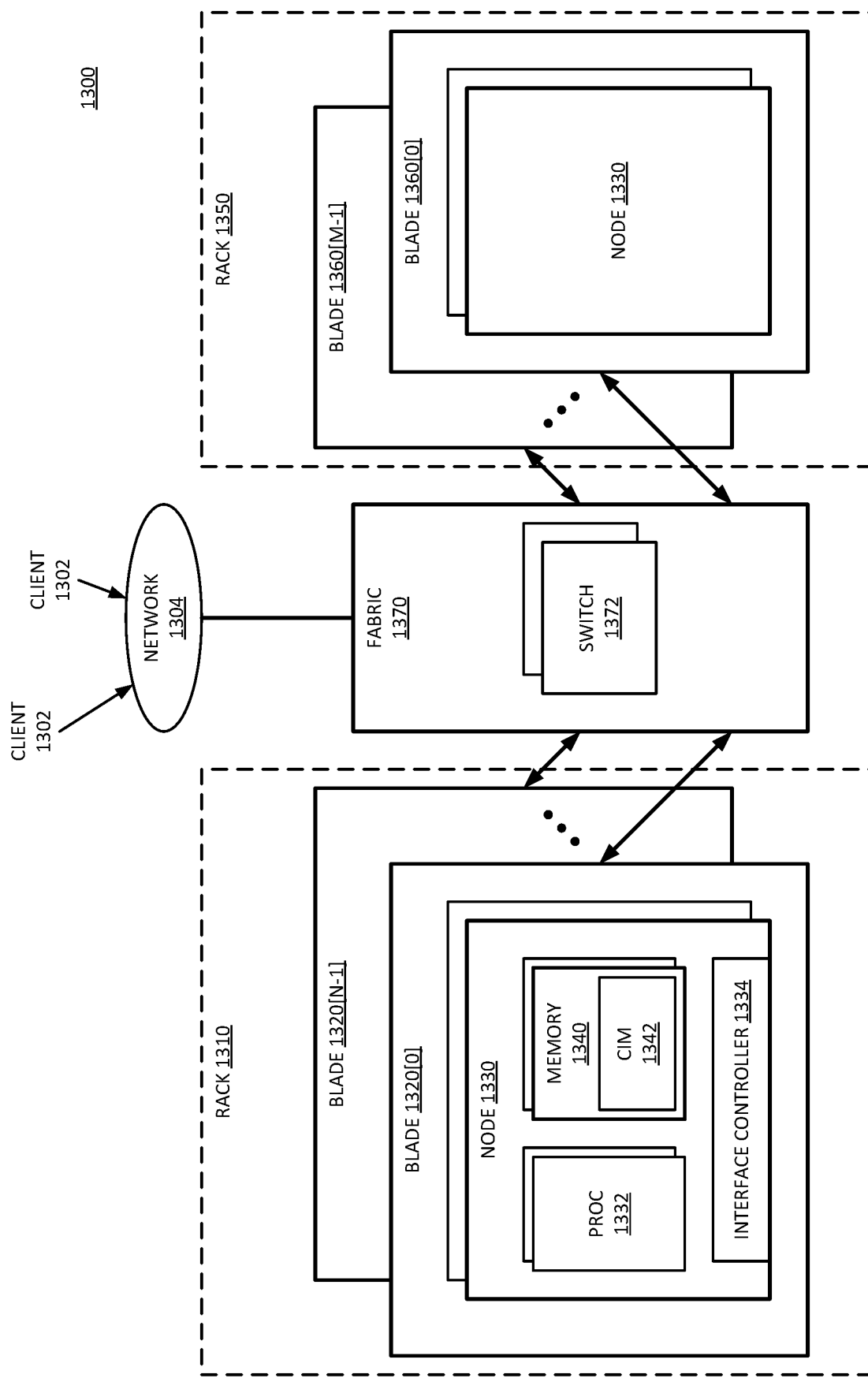
FIG. 13 is a block diagram of an example of a multi-node network in which compute-in-memory (CIM) operations with a time-to-digital circuit can be implemented.

FIG. 13 is a block diagram of an example of a multi-node network in which compute-in-memory (CIM) operations with a time-to-digital circuit can be implemented. System 1300 represents a network of nodes in accordance with any example described herein. In one example, system 1300 represents a data center. In one example, system 1300 represents a server farm. In one example, system 1300 represents a data cloud or a processing cloud.

In one example, node 1330 includes memory 1340, which includes CIM 1342. CIM 1342 represents CIM circuitry in accordance with any description herein. With CIM 1342, memory 1340 becomes a computation resource for node 1330. More specifically, CIM 1342 enables node 1330 to provide improved processing of workloads that are both memory/data intensive as well as compute intensive. Instead of moving data back and forth from memory to processor, CIM 1342 enables the memory to perform computations and return a functional result to the calling processor 1332. CIM 1342 can be implemented as a standalone resource within memory 1340. In one example, CIM 1342 is implemented as a cache on processor 1332. In one example, CIM 1342 is a separate blade as an accelerator for a blade of processor resources. CIM circuitry 1342 includes TDCs to measure discharge time of the memory array columns and provide a digital TDC value to an in-memory processor of the CIM circuitry.

One or more clients 1302 make requests over network 1304 to system 1300. Network 1304 represents one or more local networks, or wide area networks, or a combination. Clients 1302 can be human or machine clients, which generate requests for the execution of operations by system 1300. System 1300 executes applications or data computation tasks requested by clients 1302.

In one example, system 1300 includes one or more racks, which represent structural and interconnect resources to house and interconnect multiple computation nodes. In one example, rack 1310 includes multiple nodes 1330. In one example, rack 1310 hosts multiple blade components 1320. Hosting refers to providing power, structural or mechanical support, and interconnection. Blades 1320 can refer to computing resources on printed circuit boards (PCBs), where a PCB houses the hardware components for one or more nodes 1330. In one example, blades 1320 do not include a chassis or housing or other "box" other than that provided by rack 1310. In one example, blades 1320 include housing with exposed connector to connect into rack 1310. In one example, system 1300 does not include rack 1310, and each blade 1320 includes a chassis or housing that can stack or otherwise reside in close proximity to other blades and allow interconnection of nodes 1330.

System 1300 includes fabric 1370, which represents one or more interconnectors for nodes 1330. In one example, fabric 1370 includes multiple switches 1372 or routers or other hardware to route signals among nodes 1330. Additionally, fabric 1370 can couple system 1300 to network 1304 for access by clients 1302. In addition to routing equipment, fabric 1370 can be considered to include the cables or ports or other hardware equipment to couple nodes 1330 together. In one example, fabric 1370 has one or more associated protocols to manage the routing of signals through system 1300. In one example, the protocol or protocols is at least partly dependent on the hardware equipment used in system 1300.

As illustrated, rack 1310 includes N blades 1320. In one example, in addition to rack 1310, system 1300 includes rack 1350. As illustrated, rack 1350 includes M blades 1360. M is not necessarily the same as N; thus, it will be understood that various different hardware equipment components could be used, and coupled together into system 1300 over fabric 1370. Blades 1360 can be the same or similar to blades 1320. Nodes 1330 can be any type of node and are not necessarily all the same type of node. System 1300 is not limited to being homogenous, nor is it limited to not being homogenous.

For simplicity, only the node in blade 1320[0] is illustrated in detail. However, other nodes in system 1300 can be the same or similar. At least some nodes 1330 are computation nodes, with processor (proc) 1332 and memory 1340. A computation node refers to a node with processing resources (e.g., one or more processors) that executes an operating system and can receive and process one or more tasks. In one example, at least some nodes 1330 are server nodes with a server as processing resources represented by processor 1332 and memory 1340. A storage server refers to a node with more storage resources than a computation node, and rather than having processors for the execution of tasks, a storage server includes processing resources to manage access to the storage nodes within the storage server.

In one example, node 1330 includes interface controller 1334, which represents logic to control access by node 1330 to fabric 1370. The logic can include hardware resources to interconnect to the physical interconnection hardware. The logic can include software or firmware logic to manage the interconnection. In one example, interface controller 1334 is or includes a host fabric interface, which can be a fabric interface in accordance with any example described herein.

Processor 1332 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1340 can be or include memory devices and a memory controller.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In general with respect to the descriptions herein, in one example a memory circuit includes: an array of memory cells addressable with column address and row address; compute in memory (CIM) sense circuitry to sense a voltage for multiple memory cells triggered together, the CIM sense circuitry including a time to digital converter (TDC) circuit to convert a time for discharge of the multiple memory cells to a digital value; and a processing circuit to determine a value of the multiple memory cells based on the digital value.

In one example, the array of memory cells includes 6-transistor (6T) static random access memory (SRAM) memory cells, 8-transistor (8T) SRAM memory cells, or 10-transistor (10T) SRAM memory cells. In one example, the array of memory cells includes resistive-based random access memory (RAM) memory cells. In one example, the column address is to activate a wordline, and wherein the row address is to charge a bitline. In one example, the bitline comprises a differential bitline, wherein the TDC is to convert the time for discharge from a differential signal from the differential bitline. In one example, the TDC circuit comprises a series of delay cells, with a number of delays in the series to correspond to a number of bits of resolution of the digital value. In one example, the TDC circuit is to convert the time for discharge based on a fixed initial voltage reference and a fixed final voltage reference. In one example, the memory circuit further includes: row access circuitry to drive multiple rows of the array in accordance with a bit pattern of a first data word to trigger the multiple memory cells together to multiply with a second data word stored in the multiple memory cells. In one example, the array is to store the second data word in column major format, where consecutive bits of the data word are to be stored at a same column address of different rows. In one example, the row access circuitry is to drive the multiple rows with a same bit of the first data word, wherein the processing circuit is to perform shift operations for consecutive read operations on column addresses to weight the bits of the second data word for bit serial operation. In one example, the array is to store a data word in row major format, where consecutive bits of the data word are to be stored at sequential column addresses of a same row. In one example, the row access circuitry is to drive the multiple rows with same bit position of multiple first data words, wherein the processing circuit is to perform shift operations for consecutive read operations on column addresses to weight the bits of the second data word for bit serial operation.

In general with respect to the descriptions herein, in one example a computing device including: a host processor; a memory device including a memory array; and a compute-in-memory circuit including an array of memory cells addressable with column address and row address; compute in memory (CIM) sense circuitry to sense a voltage for multiple memory cells triggered together, the CIM sense circuitry including a time to digital converter (TDC) circuit to convert a time for discharge of the multiple memory cells to a digital value; and a processing circuit separate from the host processor to determine a value of the multiple memory cells based on the digital value.

In one example, the column address is to activate a wordline, and wherein the row address is to charge a bitline, wherein the bitline comprises a differential bitline, wherein the TDC is to convert the time for discharge from a differential signal from the differential bitline. In one example, the TDC circuit comprises a series of delay cells, with a number of delays in the series to correspond to a number of bits of resolution of the digital value. In one example, the TDC circuit is to convert the time for discharge based on a fixed initial voltage reference and a fixed final voltage reference. In one example, the computing device further includes: row access circuitry to drive multiple rows of the array in accordance with a bit pattern of a first data word to multiply with a second data word stored in the array; wherein the array is to store the second data word in column major format, where consecutive bits of the data word are to be stored at a same column address of different rows, wherein the row access circuitry is to drive the multiple rows with a same bit of the first data word, wherein the processing circuit is to perform shift operations for consecutive read operations on column addresses to weight the bits of the second data word for bit serial operation. In one example, the computing device further includes: row access circuitry to drive multiple rows of the array in accordance with a bit pattern of a first data word to multiply with a second data word stored in the array; wherein the array is to store a data word in row major format, where consecutive bits of the data word are to be stored at sequential column addresses of a same row, wherein the row access circuitry is to drive the multiple rows with same bit position of multiple first data words, wherein the processing circuit is to perform shift operations for consecutive read operations on column addresses to weight the bits of the second data word for bit serial operation. In one example, the host processor comprises a multicore central processing unit (CPU) or a multicore graphics processing unit (GPU). In one example, the computing device further includes: a display communicatively coupled to host processor; a network interface communicatively coupled to host processor; or a battery to power the computing device.

In general with respect to the descriptions herein, in one example a method in a memory circuit includes: sensing a voltage for multiple memory cells of an array of memory cells addressable with column address and row address, which are triggered together; converting a time for discharge of the multiple memory cells to a digital value with a time to digital converter (TDC) circuit; and determining a value of the multiple memory cells based on the digital value.

In general with respect to the descriptions herein, in one example an apparatus includes: means for sensing a voltage for multiple memory cells of an array of memory cells addressable with column address and row address, which are triggered together; means for converting a time for discharge of the multiple memory cells to a digital value with a time to digital converter (TDC) circuit; and means for determining a value of the multiple memory cells based on the digital value.

In general with respect to the descriptions herein, in one example an article of manufacture comprising a computer readable storage medium having content storage thereon, which when accessed provides instructions to cause a machine to perform operations to execute a method including: sensing a voltage for multiple memory cells of an array of memory cells addressable with column address and row address, which are triggered together; converting a time for discharge of the multiple memory cells to a digital value with a time to digital converter (TDC) circuit; and determining a value of the multiple memory cells based on the digital value.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory circuit, comprising:
an array of memory cells addressable with column address and row address;
compute in memory (CIM) sense circuitry including a time to digital converter (TDC) circuit to sense a voltage from multiple memory cells of the array triggered with column address and row address to select the multiple memory cells together, the voltage corresponding to values stored at all the selected multiple memory cells, the TDC circuit to convert a time for discharge of the voltage of the multiple memory cells to a digital value;
a processing circuit to determine the values stored in the multiple memory cells based on the digital value; and
row access circuitry to drive multiple rows of the array in accordance with a bit pattern of a first data word to trigger the multiple memory cells together to multiply with a second data word stored in the multiple memory cells.

2. The memory circuit of claim 1, wherein the array of memory cells includes 6-transistor (6T) static random access memory (SRAM) memory cells, 8-transistor (8T) SRAM memory cells, or 10-transistor (10T) SRAM memory cells.

3. The memory circuit of claim 1, wherein the array of memory cells includes resistive-based random access memory (RAM) memory cells.

4. The memory circuit of claim 1, wherein the column address is to activate a wordline, and wherein the row address is to charge a bitline.

5. The memory circuit of claim 4, wherein the bitline comprises a differential bitline, wherein the TDC is to convert the time for discharge from a differential signal from the differential bitline.

6. The memory circuit of claim 1, wherein the TDC circuit comprises a series of delay cells, with a number of delays in the series to correspond to a number of bits of resolution of the digital value.

7. The memory circuit of claim 1, wherein the TDC circuit is to convert the time for discharge based on a fixed initial voltage reference and a fixed final voltage reference.

8. The memory circuit of claim 1, wherein the array is to store the second data word in column major format, where consecutive bits of the second data word are to be stored at a same column address of different rows.

9. The memory circuit of claim 8, wherein the row access circuitry is to drive the multiple rows with a same bit of the first data word, wherein the processing circuit is to perform shift operations for consecutive read operations on column addresses to weight the consecutive bits of the second data word for bit serial operation.

10. The memory circuit of claim 1, wherein the array is to store a data word in row major format, where consecutive bits of the data word are to be stored at sequential column addresses of a same row.

11. The memory circuit of claim 10, wherein the row access circuitry is to drive the multiple rows with same bit position of multiple first data words, wherein the processing circuit is to perform shift operations for consecutive read operations on column addresses to weight the consecutive bits of the second data word for bit serial operation.

12. A computing device, comprising:
a host processor;
a memory device including a memory array; and
a compute-in-memory circuit including
an array of memory cells addressable with column address and row address;
compute in memory (CIM) sense circuitry including a time to digital converter (TDC) circuit to sense a voltage from multiple memory cells triggered with column address and row address to select the multiple memory cells together, the voltage corresponding to values stored at all the selected multiple memory cells, the TDC circuit to convert a time for discharge of the voltage of the multiple memory cells to a digital value;

a processing circuit separate from the host processor to determine the values stored in the multiple memory cells based on the digital value; and row access circuitry to drive multiple rows of the memory array in accordance with a bit pattern of a first data word to multiply with a second data word stored in the memory array.

13. The computing device of claim 12, wherein the column address is to activate a wordline, and wherein the row address is to charge a bitline, wherein the bitline comprises a differential bitline, wherein the TDC is to convert the time for discharge from a differential signal from the differential bitline.

14. The computing device of claim 12, wherein the TDC circuit comprises a series of delay cells, with a number of delays in the series to correspond to a number of bits of resolution of the digital value.

15. The computing device of claim 12, wherein the TDC circuit is to convert the time for discharge based on a fixed initial voltage reference and a fixed final voltage reference.

16. The computing device of claim 12,
wherein the memory array is to store the second data word in column major format, where consecutive bits of the second data word are to be stored at a same column address of different rows, wherein the row access circuitry is to drive the multiple rows with a same bit of the first data word, wherein the processing circuit is to perform shift operations for consecutive read operations on column addresses to weight the bits of the second data word for bit serial operation.

17. The computing device of claim 12,
wherein the memory array is to store a data word in row major format, where consecutive bits of the data word are to be stored at sequential column addresses of a same row, wherein the row access circuitry is to drive the multiple rows with same bit position of multiple first data words, wherein the processing circuit is to perform shift operations for consecutive read operations on column addresses to weight the bits of the second data word for bit serial operation.

18. The computing device of claim 12, wherein the host processor comprises a multicore central processing unit (CPU) or a multicore graphics processing unit (GPU).

19. The computing device of claim 12, further comprising:
a display communicatively coupled to the host processor;
a network interface communicatively coupled to the host processor; or
a battery to power the computing device.

* * * * *